(12) United States Patent
Coyne

(10) Patent No.: US 8,803,193 B2
(45) Date of Patent: Aug. 12, 2014

(54) OVERVOLTAGE AND/OR ELECTROSTATIC DISCHARGE PROTECTION DEVICE

(75) Inventor: Edward Coyne, Ardrahan (IE)

(73) Assignee: Analog Devices, Inc., Norwood, MA (US)

( * ) Notice: Subject to any disclaimer, the term of this patent is extended or adjusted under 35 U.S.C. 154(b) by 104 days.

(21) Appl. No.: 13/436,502

(22) Filed: Mar. 30, 2012

(65) Prior Publication Data

US 2012/0286327 A1 Nov. 15, 2012

Related U.S. Application Data

(63) Continuation-in-part of application No. 13/105,622, filed on May 11, 2011, now Pat. No. 8,421,189, and a continuation-in-part of application No. 13/105,667, filed on May 11, 2011, and a continuation-in-part of application No. 13/279,122, filed on Oct. 21, 2011.

(51) Int. Cl.
*H01L 29/66* (2006.01)
*H01L 29/02* (2006.01)

(52) U.S. Cl.
USPC ............... 257/173; 257/488; 257/E29.181; 257/E29.187

(58) Field of Classification Search
USPC ............... 257/173, 355, 488, 572, E29.181, 257/E29.187, E27.019; 327/551
See application file for complete search history.

(56) References Cited

U.S. PATENT DOCUMENTS

| | | | |
|---|---|---|---|
| 3,660,687 A | 5/1972 | Sahm et al. | |
| 3,764,864 A | 10/1973 | Okumura et al. | |
| 4,520,277 A | 5/1985 | Hahn | |
| 4,528,461 A | 7/1985 | Shackle et al. | |
| 5,091,763 A | 2/1992 | Sanchez | |
| 5,212,106 A | 5/1993 | Erb et al. | |
| 5,371,401 A | 12/1994 | Kurita | |

(Continued)

FOREIGN PATENT DOCUMENTS

| | | |
|---|---|---|
| EP | 0 234 269 | 9/1987 |
| EP | 0 730 293 | 9/1996 |

(Continued)

OTHER PUBLICATIONS

De Heyn et al "Design and Analysis of New Protection Structures for Smart Power Technology with Controlled Trigger and Holding Voltage" 2001 IEEE International Reliability Physics Symposium Proceedings 39$^{th}$ Annual, Orlando Florida, Apr. 30-May 3, 2001, IEEE International Reliability Physics Symposium, New York, NY, IEEE Apr. 30, 2001, pp. 253-258.

(Continued)

*Primary Examiner* — William F Kraig
*Assistant Examiner* — Khaja Ahmad
(74) *Attorney, Agent, or Firm* — Knobbe, Martens, Olson & Bear, LLP

(57) ABSTRACT

An overvoltage protection device in combination with a filter, the overvoltage protection device having a first node for connection to a node to be protected, a second node for connection to a discharge node; and a control node; and wherein the filter comprises at least one of: (a) a capacitor connected between the first node and the discharge node; (b) a capacitor connected between the control node and the discharge node; or (c) an inductor in series connection with the first node.

27 Claims, 25 Drawing Sheets

(56) References Cited

U.S. PATENT DOCUMENTS

| | | | |
|---|---|---|---|
| 5,432,366 A | 7/1995 | Banerjee et al. | |
| 5,436,486 A | 7/1995 | Fujishima et al. | |
| 5,440,151 A | 8/1995 | Crevel et al. | |
| 5,440,162 A * | 8/1995 | Worley et al. | 257/355 |
| 5,473,169 A | 12/1995 | Ker et al. | |
| 5,485,023 A | 1/1996 | Sumida | |
| 5,576,574 A | 11/1996 | Hong | |
| 5,594,266 A | 1/1997 | Beigel et al. | |
| 5,610,425 A | 3/1997 | Quigley et al. | |
| 5,637,892 A | 6/1997 | Leach | |
| 5,637,901 A | 6/1997 | Beigel et al. | |
| 5,663,860 A | 9/1997 | Swonger | |
| 5,668,024 A | 9/1997 | Tsai et al. | |
| 5,736,769 A | 4/1998 | Nishiura et al. | |
| 5,757,045 A | 5/1998 | Tsai et al. | |
| 5,832,376 A * | 11/1998 | Henderson et al. | 455/327 |
| 5,862,301 A * | 1/1999 | Gontowski, Jr. | 388/800 |
| 5,892,624 A | 4/1999 | Kintz et al. | |
| 5,912,490 A | 6/1999 | Hebert et al. | |
| 6,084,269 A | 7/2000 | Davies et al. | |
| 6,159,814 A | 12/2000 | Gardner et al. | |
| 6,248,652 B1 | 6/2001 | Kokubun | |
| 6,365,475 B1 | 4/2002 | Cheng et al. | |
| 6,707,118 B2 | 3/2004 | Muljono et al. | |
| 6,713,816 B1 | 3/2004 | Wolf et al. | |
| 6,882,009 B2 | 4/2005 | Ker et al. | |
| 6,927,957 B1 | 8/2005 | Bakulin et al. | |
| 7,471,493 B1 | 12/2008 | Huang et al. | |
| 7,859,082 B2 | 12/2010 | Stecher | |
| 8,476,684 B2 | 7/2013 | Coyne et al. | |
| 2002/0074604 A1 * | 6/2002 | Wang et al. | 257/355 |
| 2002/0125931 A1 * | 9/2002 | Yue et al. | 327/310 |
| 2003/0116785 A1 | 6/2003 | D'Anna et al. | |
| 2003/0209758 A1 | 11/2003 | Lee et al. | |
| 2005/0057866 A1 | 3/2005 | Mergens et al. | |
| 2005/0111150 A1 | 5/2005 | Jang et al. | |
| 2005/0280091 A1 * | 12/2005 | Huang et al. | 257/355 |
| 2007/0087500 A1 | 4/2007 | Son et al. | |
| 2008/0218920 A1 | 9/2008 | Vanysacker et al. | |
| 2008/0237707 A1 | 10/2008 | Suzuki et al. | |
| 2009/0032837 A1 | 2/2009 | Tseng et al. | |
| 2009/0122452 A1 * | 5/2009 | Okushima | 361/56 |
| 2010/0027174 A1 | 2/2010 | Galy et al. | |
| 2010/0059028 A1 | 3/2010 | Ueno | |
| 2010/0109631 A1 * | 5/2010 | Vinson | 323/282 |
| 2010/0121404 A1 | 5/2010 | Bjorling et al. | |
| 2010/0155858 A1 | 6/2010 | Chen | |
| 2010/0163986 A1 | 7/2010 | Kim | |
| 2010/0171149 A1 * | 7/2010 | Denison et al. | 257/173 |
| 2010/0301389 A1 * | 12/2010 | Kushner et al. | 257/173 |
| 2010/0321092 A1 | 12/2010 | Momota et al. | |
| 2011/0101444 A1 | 5/2011 | Coyne et al. | |
| 2011/0133246 A1 | 6/2011 | Ueno | |
| 2012/0091503 A1 | 4/2012 | Su | |
| 2012/0133025 A1 | 5/2012 | Clarke et al. | |
| 2012/0175673 A1 | 7/2012 | Lee | |
| 2012/0182659 A1 * | 7/2012 | Wang et al. | 361/91.5 |
| 2012/0286396 A1 | 11/2012 | Coyne | |

FOREIGN PATENT DOCUMENTS

| | | |
|---|---|---|
| EP | 2 246 885 A1 | 11/2010 |
| WO | WO 95/22842 | 8/1995 |
| WO | WO 97/10615 | 3/1997 |

OTHER PUBLICATIONS

Gendron et al. "Deep trench NPN Transistor for Low-RON ESD Protection of High-Voltage I/Os in Advanced Smart Power Technology", Bipolar/Bicmos Circuits and Technology Meeting, 2006, IEEE, Piscataway, NJ, USA, Oct. 1, 2006, pp. 1-4.

Urresti J et al: "Lateral punch-through TVS devices for on-chip protection in low-voltage applications", Microelectronics and Reliability, Elsevier Science LTD, GB, vol. 45, No. 7-8, Jul. 1, 2005, pp. 1181-1186, XP027853635.

Walker A J et al: "Novel Robust High Voltage ESD Clamps for LDMOS Protection", Physics Symposium, 2007, Proceedings, 45TH Annual, IEEE International, IEEE, PI, Apr. 1, 2007, pp. 596-597.

International Search Report and Written Opinion mailed Jul. 20, 2012 for International Application PCT/US2012/037028, 14 pages.

Baliga, "Silicon RF Power Mosfets", World Scientific, 2005, Chapter 4 Lateral-Diffused MOSFETs, 33 pages.

* cited by examiner

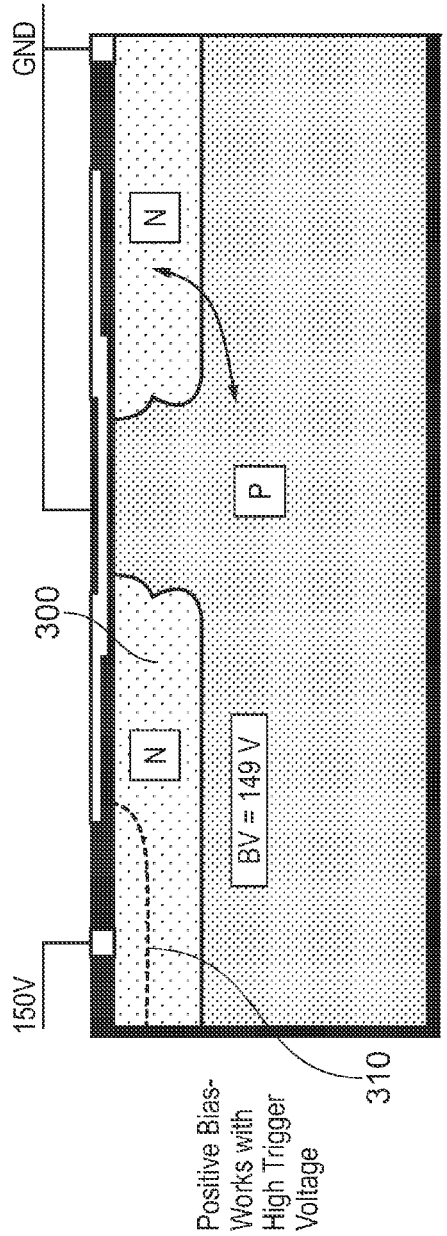
FIG. 9a - Conventional Art
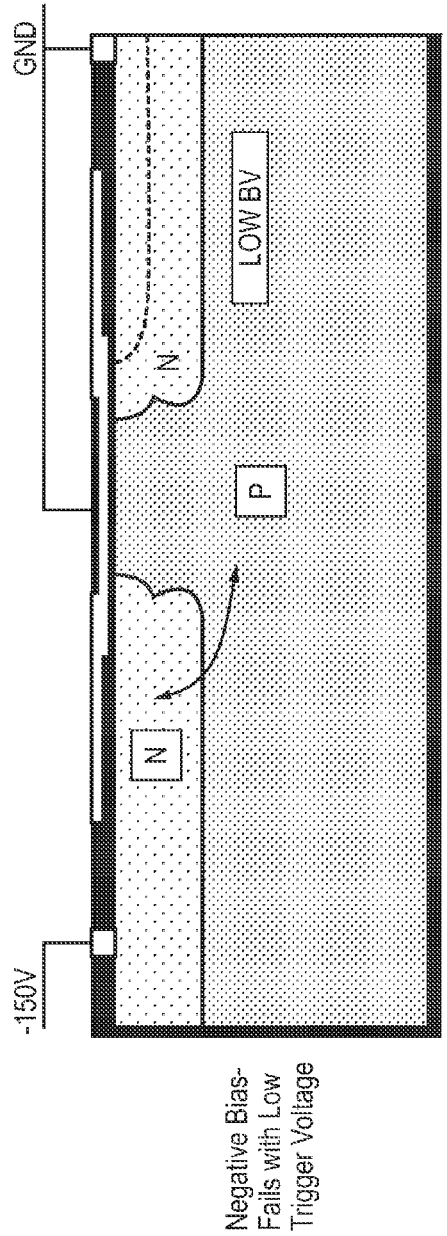
FIG. 9b - Conventional Art

Positive Bias-
Works with
High Trigger
Voltage

Negative Bias-
Works with
High Trigger
Voltage

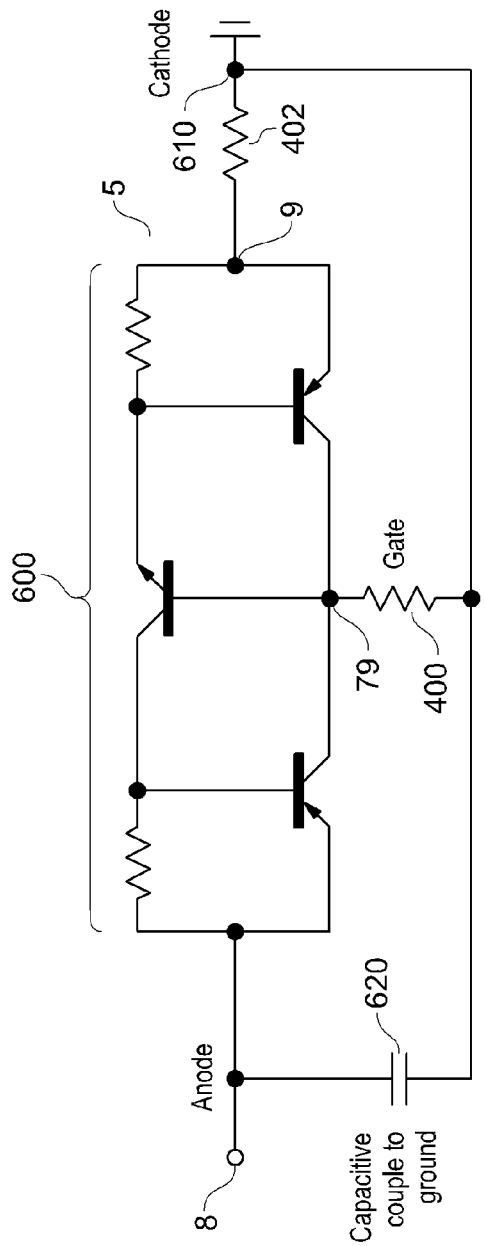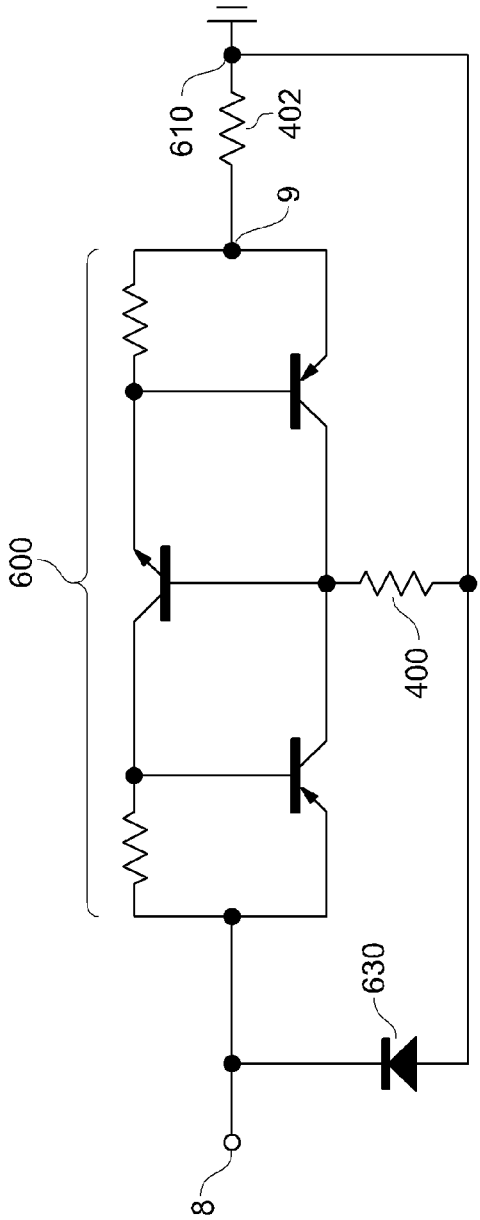

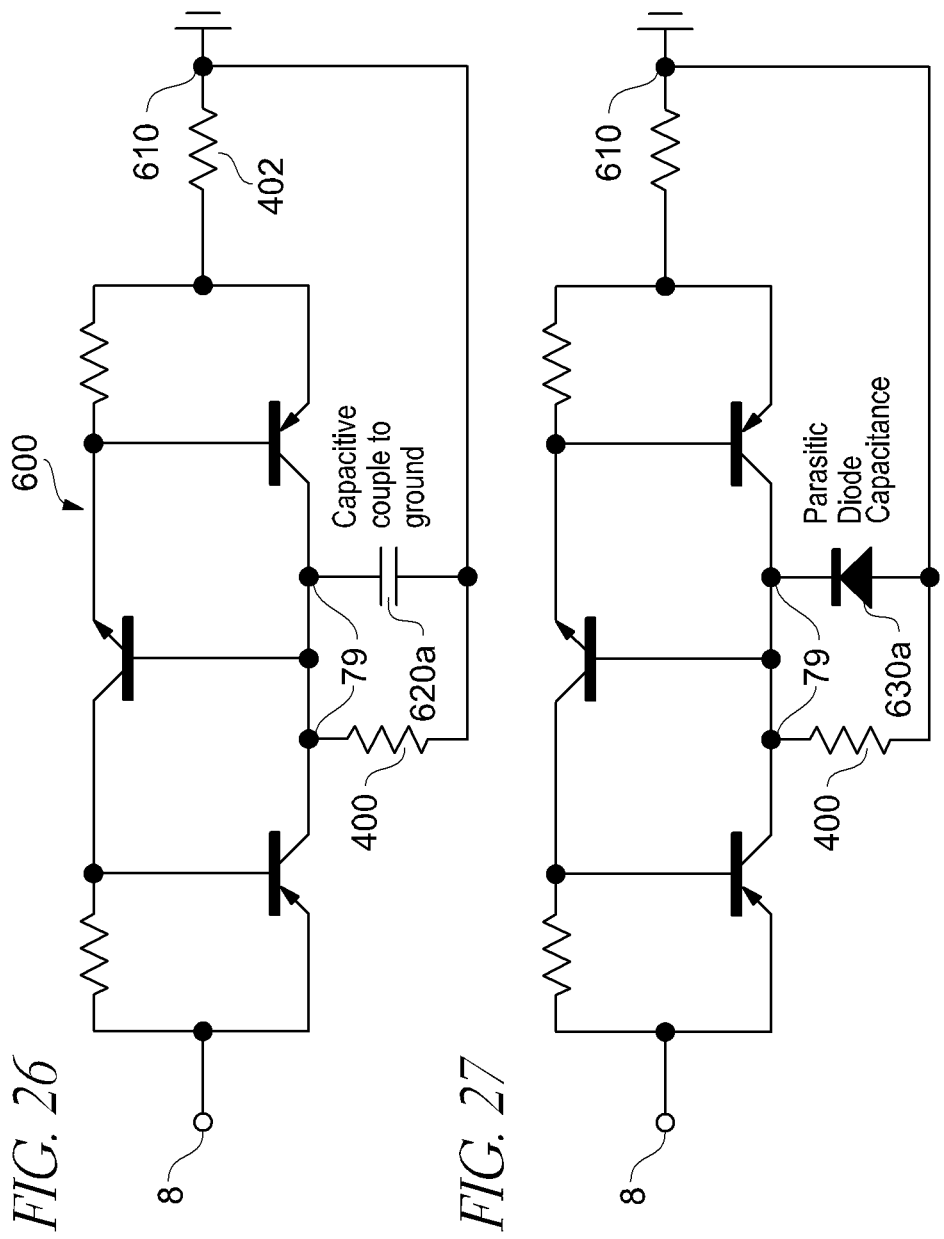

OVERVOLTAGE AND/OR ELECTROSTATIC DISCHARGE PROTECTION DEVICE

CROSS-REFERENCE TO RELATED APPLICATIONS

This application is a continuation-in-part (CIP) of copending applications titled APPARATUS FOR ELECTROSTATIC DISCHARGE PROTECTION, having Ser. Nos. 13/105,622 and 13/105,667, both filed May 11, 2011, and is a CIP of copending application titled OVERVOLTAGE AND/OR ELECTROSTATIC PROTECTION DEVICE, having Ser. No. 13/279,122, filed on Oct. 21, 2011, the disclosures of each of which are hereby incorporated by reference in their entireties herein.

FIELD OF THE INVENTION

Embodiments of the invention relate to a device that can perform overvoltage protection and electrostatic discharge (ESD) protection and that can be formed within a monolithic integrated circuit.

BACKGROUND OF THE INVENTION

Electronic circuits can be damaged by electrostatic potentials, or just high voltage transients in general. This is particularly true for field effect transistors.

Protection can, for example, be provided by placing reverse biased diodes between a node which is to be protected and power supply rails. As used herein, "node to be protected" will refer to any one or more elements, conductors or terminals that are to be protected against electrostatic damage.

A disadvantage with diodes is that they start conducting as soon as the necessary forward bias voltage, typically 0.7 volts, has been achieved. Thus if it is desired to protect against overvoltage events of positive and negative going polarity, then it is difficult to prevent the diodes from conducting when legitimately supplied voltages might fall outside the supply rail voltage of the device incorporating or attached to the node to be protected. Thus, it is desirable to set a "protection voltage" at which protection is initiated independently of the supply voltage.

A further disadvantage with diodes is that they exhibit a resistive current-voltage characteristic once they switch on. This means that the time taken to conduct an electrostatic discharge safely away might be unnecessarily long. Also since the rate of current flow is restricted by the resistance of the diode, the peak voltage experienced by the protected node might be unnecessarily high. This may be especially significant for cases in which the overvoltage events result from the presence of inductive components as opposed to electrostatic discharges. Diodes are not the only form of overvoltage protection that can be employed, but they serve to illustrate some of the issues that need to be overcome.

SUMMARY

In an embodiment, there is provided an overvoltage protection device in combination with a filter, the overvoltage protection device having: a first node for connection to a node to be protected; a second node for connection to a discharge node; and a control node, and wherein the filter comprises at least one of: (a) a capacitor connected between the first node and the discharge node; (b) a capacitor connected between the control node and the discharge node; or (c) an inductor in series with the first node.

Preferably, the overvoltage protection device is operable to provide protection against overvoltage events of positive and negative polarity and an embodiment of the overvoltage protection device comprises: an NPN semiconductor structure defining: a first N-type region; a first P-type region; and a second N-type region; wherein one of the first or second N-type regions is connected to a terminal, conductor or node that is to be protected against an overvoltage event, and the other one of the first or second N-type regions is connected to a reference, and advantageously a field plate is in electrical contact with the first P-type region, and the field plate overlaps with but is isolated from portions of the first and second N-type regions.

It is thus possible to provide a device that can be switched into a conducting state, either in response to an external stimulus or in response to internal electric fields, and that once it has switched on becomes low impedance to conduct the charge of the electrostatic discharge event or other overvoltage event away. Advantageously the device is provided as a lateral bipolar transistor.

In one embodiment, the response of the device to an overvoltage event such as an electrostatic discharge is substantially independent of the polarity of the discharge event. Thus, for example, if the device has a trigger voltage of nominally 225 volts, then the device should remain in a high impedance state until a voltage of more than +225 volts occurs at the protected node or until a voltage of less than −225 volts occurs at the protected node.

In order to achieve this, the doping concentration of the first and second N-type regions should be substantially equal. Additionally, when the conduction is to be triggered by punch-through mechanisms, then the distances between PN boundaries of the first and second N-type regions with the first P-type region, respectively, and internal punch through structures in the N-type regions should be about the same for each of the first and second N-type regions. However, if an asymmetric voltage response is desired, then the doping and/or distances can be varied with respect to each other.

In one embodiment, the overvoltage protection device is arranged to temporarily latch on in response to an overvoltage condition. Thus, after the device is triggered to conduct, the device forces itself into a low impedance state irrespective of the amount of current being provided at a turn on terminal or region of the device.

Such a latching function can be provided by fabricating a PNP transistor sharing N and P regions with the NPN transistor such that the transistors cooperate to turn each other on. Such a structure is known in the art as a silicon-controlled rectifier or SCR.

Advantageously, although a silicon controlled rectifier will turn itself off once the current flow through it decreases to a small enough value, a switch off circuit can be associated with the overvoltage protection device to force the device to revert to a high impedance state once the voltage at the protected node has fallen below a turn off threshold.

The switch off circuit may comprise active devices such as transistors operating under the influence of a timer to pull the base of the lateral NPN transistor to the emitter voltage of the transistor so as to switch the transistor into a high impedance state.

Preferably the switch off circuit comprises passive impedances which control a split between current flow through the base region and emitter region of the lateral NPN transistor and this in turn controls a foldback voltage that the protection circuit exhibits.

While described in the context of particular embodiments, the principles and advantages disclosed herein are applicable to alternative embodiments in which the P and N dopings are swapped, the descriptions of positive and negative voltage reversed, and the descriptions directions of current reversed.

BRIEF DESCRIPTION OF THE DRAWINGS

These drawings and the associated description herein are provided to illustrate specific embodiments of the invention and are not intended to be limiting. Embodiments of the invention will now be described, by way of non-limiting example with reference to the accompanying figures in which:

FIG. 4 is a cross section through a protection device having internal structures for self initiating switch on;

FIGS. 9a and 9b illustrate how a prior art connection arrangement, when applied to the protection device, gives protection to only one polarity of overvoltage event;

FIG. 23 is a schematic diagram of a protection device as described with respect to FIGS. 1 to 19, in association with a reactive filter impedance;

FIG. 24 is a schematic diagram of a further circuit in which a protection device is in association with a further component that can exhibit a reactive impedance;

FIG. 26 is a circuit diagram for a further configuration of a protection device in combination with a capacitor;

FIG. 27 is a circuit diagram for a configuration of a protection device in combination with a reverse biased diode;

DESCRIPTION OF SOME EMBODIMENTS

Figure 1:
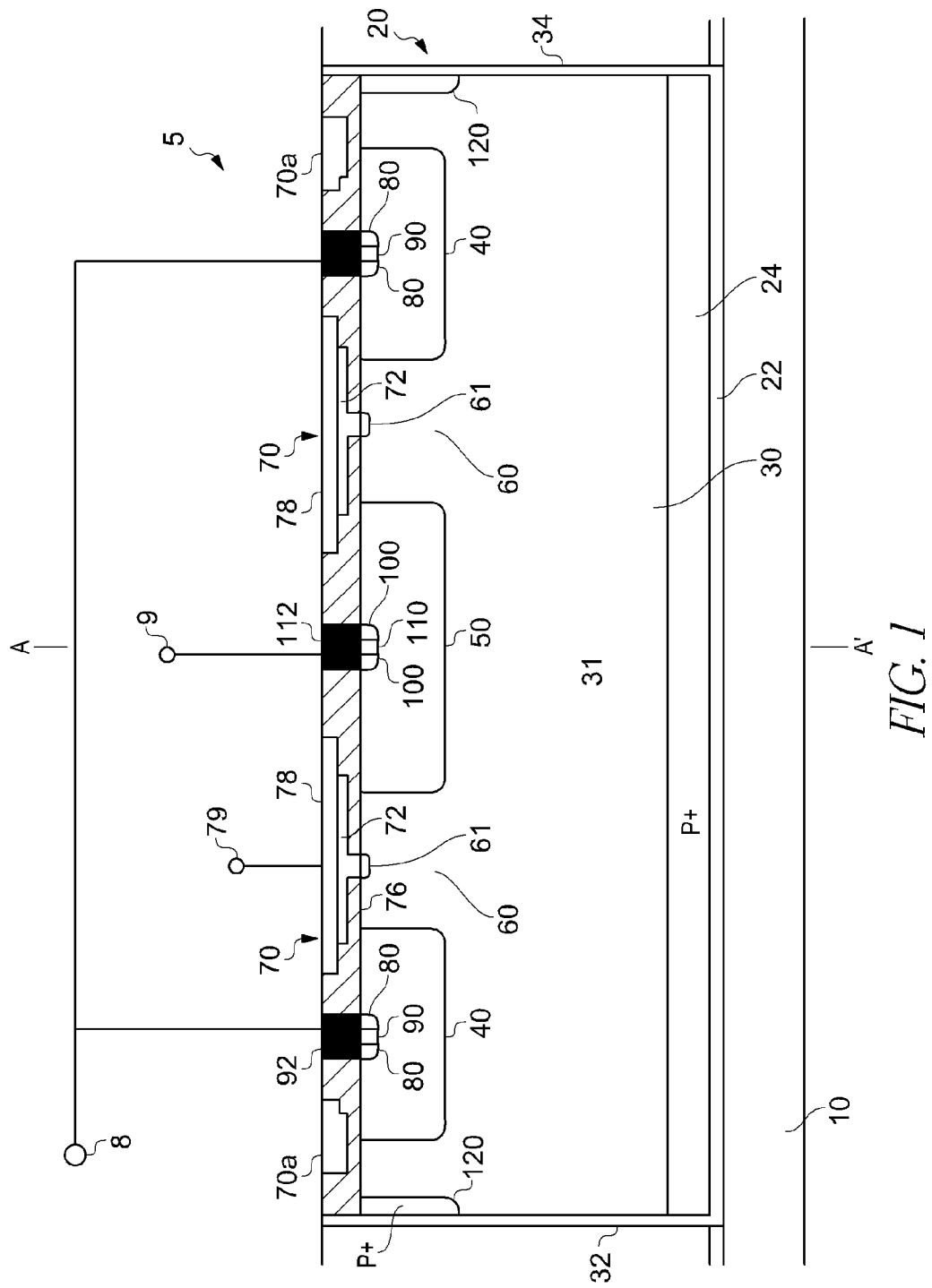
FIG. 1 is a cross section through a protection device comprising a voltage clamping device according to an embodiment of the invention.

FIG. 1 is a schematic cross section of a protection device (or voltage clamp) 5 according to an embodiment of the invention and operable to provide overvoltage protection to a protected node 8. Another node 9 of the device is connected to a reference, such as ground. As the device is symmetric in its response in the illustrated embodiment, the nodes 8 and 9 can be interchanged.

For the purposes of simplifying the description, terms such as "above", "next to", "left of" and so on will be used to refer to features in a device orientated as shown in the Figures. Similarly, where regions having different doping concentrations or different dopant types are adjacent one another, then the regions are shown as being delimited by a boundary although such a boundary is not discernable in the actual device.

The arrangement shown in FIG. 1 generally comprises a substrate 10 over which the protection device 5 is formed within an insulated well 20.

In order to do this, a layer of insulation 22, such as a layer of silicon dioxide, is formed over the substrate 10. Then an epitaxial layer 30 may be formed above the insulating layer 22.

Optionally, a relatively heavily doped P+ layer 24 may be deposited over the insulating layer 22. Then the epitaxial layer 30 is provided as a less doped P layer deposited over the P+ layer 24 (if it was provided) or formed directly over the insulating layer 22 if the P+ layer 24 was omitted.

The P-type material of the epitaxial layer 30 forms a body 31 of the overvoltage protection device. The body 31 is formed in a well delimited by the insulating layer 22, a left hand insulating wall 32, a right hand insulating wall 34 and further insulating walls extending parallel with the plane of FIG. 1 in front of and behind the plane of the Figure. When, as will be discussed later, the device is considered in its three dimensional form, it will be evident that walls 32 and 34 are effectively parts of a single wall surrounding the protection device.

Thus, the body 31 of P-type material is insulated from the rest of the substrate. The formation of such insulating wells is well known to one of ordinary skill in the art. Alternatively, it is possible to form the well within a plurality of reverse biased PN junctions.

Towards the surface of the device, several N-type regions are formed within the P-type material 31. In the arrangement shown in FIG. 1, the device exhibits reflection symmetry about the line A-A'. The device may advantageously also exhibit reflection symmetry around the plane of the page.

Figure 2:
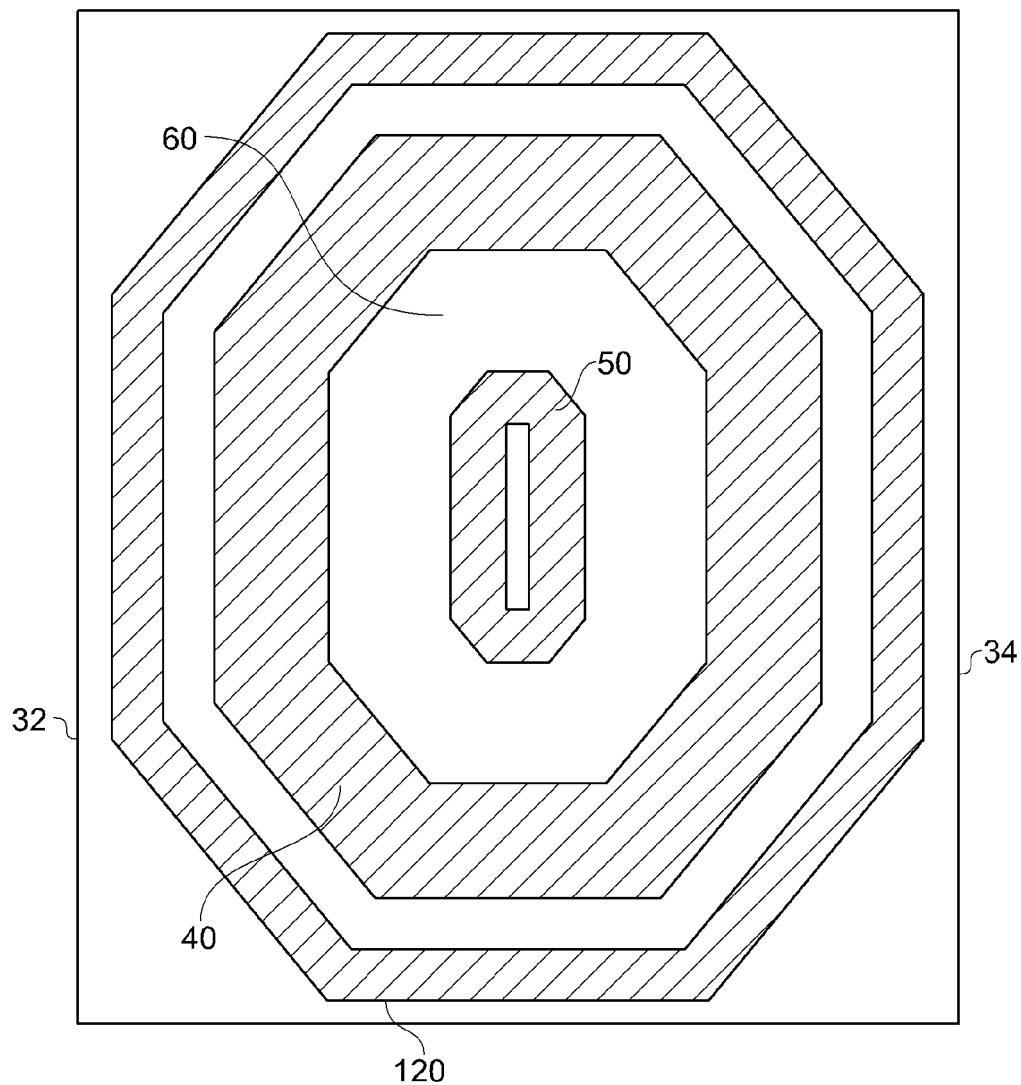
FIG. 2 is an example of a plan view of the doped regions of FIG. 1.

A first N-type region 40 is formed towards the left hand edge of the well 20. As can be seen from the plan view of the doping as shown in FIG. 2, the first N-type region 40 forms a "ring" around a centre of the device, and hence the regions 40 on the left hand side of FIG. 1 and the right hand side of FIG. 1 are in fact the same N-type region. It will be appreciated by one of ordinary skill in the art that, while the plan view of FIG. 2 shows sharp corners and parallel lines, that a device as fabricated can exhibit rounded corners and non-parallel lines. In addition, the lines can also be curved lines.

A second N-type region 50 is formed within the ring formed by the first N-type region 40, but separated thereon. The gap between the first and second N-type regions 40 and 50 is filled by the P-type material of the body 31. Thus, a lateral transistor is formed by this arrangement.

In bipolar NPN transistor fabrication, the doping between the collector and emitter regions is normally significantly different such that the depletion regions have different spatial extents, and this together with a thin base region results in the transistor exhibiting generally good current gain, for example, several hundred times, when the base of the transistor is approximately 0.7 volts above the emitter voltage. However, less well known is that those transistors still function, albeit with much reduced gain if they are reversed, so that the collector is used as the emitter and vice versa.

In the device shown in FIGS. 1 and 2 the doping concentrations in the first and second N-types regions 40 and 50 are the same, at approximately $10^{16}$ donor impurities per cubic centimeter. The P-type body 31 is more lightly doped, at about $10^{15}$ acceptor impurities for each cubic centimeter. Other doping concentrations are applicable and will be readily determined by one of ordinary skill in the art.

As a result of this doping symmetry, in practice, either one of the N-type regions 40 or 50 can function as either the emitter or the collector of the lateral N-P-N transistor depending on the polarity of the overvoltage threat.

Returning to FIG. 1, for convenience, the parts of the P-type body 31 that extend between the first and second N-type regions 40 and 50 have been designated 60, and can be regarded as forming a base of the lateral NPN transistor.

The base region is provided with a field plate. The field plate is formed by a conductive element, generally designated 70, which could be formed by a single structure of metal or polysilicon, but which in this example is formed by two co-operating parts.

A first conductive layer 72 is formed over the base region 60. However, as shown, the conductive layer 72 also slightly overlaps the edge of the first N-type region 40 and the second N-type region 50. Clearly, the conductive layer cannot be allowed to contact the base region 60 as well as the emitter and collector regions formed by N-type regions 40 and 50 because otherwise the device would be short circuited. Consequently, the conductive layer 72 is formed over an insulating layer 76, typically silicon dioxide, that insulates the conductive layer 72 from the first and second N-type regions 40 and 50. During formation of the insulating layer 76, or in a subsequent etching step, an aperture or via is formed such that the field plate 70 can make contact with the base 60.

As shown, the base 60 has small regions 61 of enhanced P-type doping, generally designated P+ to provide an enhanced interface between base 60 and the field plate 70.

Above the conductive layer 72, and hence at an increased distance from the surface of the N-type regions 40 and 50, a second conductive layer 78 is provided. This may be formed of polysilicon or metal. The second conductive layer 78 further overhangs the first and second N-type regions, 40 and 50.

The layers 72 and 78 form a field plate 70 which replicates the base potential over the edge of the N-type regions 40 and 50. This enables the depletion regions in the N-type regions 40 and 50 to extend further from the region boundary with the base 60 when the P-N junction is reverse biased and in so doing enables the device to withstand higher voltages across the reverse biased P-N junction before avalanche breakdown occurs.

The edges of a conductor give rise to higher electric field gradients than the main body of the conductor and hence in order to stop the edge of the field plate giving rise to an increased electric field gradient, which might itself trigger breakdown, the distance from the edge of the field plate to the N-type regions is increased by forming the edges of the plate, as defined by the extremity of the conductive layer 78, at an increased height above the N-type regions 40 and 50.

In order to switch the lateral N-P-N transistor on, a current can be supplied to the base for example via a control terminal 79. This can be via an external circuit to drive the transistor, in which case the circuit is connective via the control terminal 79 to the field plate so as to drive the base 60. Such an arrangement will be described later.

In addition, or as an alternative, to such external control, ionization driven breakdown can be used to switch the transistor on, as can punch through. Of these mechanisms, punch through is preferred and, as will be described later, additional structures can be formed within the device to define the voltage at which a punch through current causes the transistor to conduct.

As discussed hereinbefore, after a trigger voltage has been reached which is indicative of a voltage threat that needs to be dealt with by the protection device in order to protect other circuits connected to the protected node, then the protection device should rapidly assume a low impedance state.

Relying on current injected into the base 60 by whatever mechanism was chosen to switch on the transistor does not guarantee that the transistor will switch on hard and rapidly. To accomplish this, a second transistor can be formed. The second transistor is formed as a PNP transistor and notionally has its base connected to the collector of the NPN transistor, and its emitter connected to the base of the NPN transistor. Such a combination causes each transistor to turn the other one on, and forms a device configuration commonly known as a silicon-controlled rectifier (SCR).

In order to provide a SCR action, a vertical PNP transistor is formed. One of the P regions, that is, the region acting as the emitter, is formed by an additional (for example, a second) P+ region 80 formed in the first N-type region 40, and the collector is formed by the P-type body region 31.

In order that a low resistance connection can be made from the first N-type region 40 to the protected node 8, a highly doped N+ region 90 is formed in the first N-type region 40. For convenience, but not out of necessity, the P+ region 80 and the N+ region 90 can be formed adjacent each other such that they can share a single metal contact 92. The contact 92 is connected to the node 8.

Given that the device may have the first region 40 at a lower or higher potential than the second N-type region 50, and hence either region could act as the collector of the lateral NPN transistor, a similar vertical PNP transistor is formed in the second N-type region 50. The vertical transistor is formed by making a P+ region 100 within the second N-type region 50. Similarly, an N+ region 110 is also formed to give a relatively low resistance connection from a metal contact 112 to the second N-type region, and the regions 100 and 110 can be conveniently adjacent each other and beneath the contact 112. The contact 112 is connected to the node 9.

After the SCR configuration has turned on, it will remain conducting whilst the voltage across the device is sufficient to hold the base-emitter voltages of the bipolar transistors in a conducting state. However, if the voltage is removed, then the device switches back to a non-conducting state until the next time it is triggered.

If the protected node 8 sinks back to 0 volts After the overvoltage or electrostatic discharge threat is removed, then no further action needs to be taken. However, if the protected node does not return to 0V, for example, because it is connected to the output of another device which may be outputting a non zero voltage, then measures should be taken to cause the SCR to switch off once the overvoltage threat has been attended to. Such measures will be discussed later.

Because the protection device 5 can, as will be described later, rely on movement of depletion region boundaries under the influence of electric potentials applied to different regions of the device, it is advantageous to take measures to protect the device from perturbations in its operation caused by high potentials in components or neighboring protection devices formed within the same substrate.

To a first approximation, the distance that a depletion region extends as a result of an applied potential difference is inversely proportional to the dopant concentration in the semiconductor. Thus, the relatively highly doped region 24 protects the protection device from a depletion region spreading upwardly from the insulating layer 22 and interfering with the operation of the protection device 5.

Similarly, laterally extending potential differences can affect the operation of the protection device. In order to inhibit the growth of depletion regions from the sidewalls 32 and 34, a P+ doped guard region, which forms a guard ring 120, is provided around the lateral N-P-N transistor.

Additionally, a second field plate 70a can be formed around the periphery of first N-type region 40 so as to prevent electric field gradients around the outer edge of region 40 triggering correct flow into the P-type material 31 at voltage below the turn on voltage for the protection device.

Triggering the Protection Device

As noted earlier, the device may be internally or externally triggered. For an external trigger, the breakdown of specifically constructed diodes, such as Zener diodes or avalanche diodes, may be used as a trigger. Such diodes are available with a range of reverse bias breakdown voltages. The person having ordinary skill in the art can, for example, form zener diodes having a breakdown voltage of 7 volts or so when reverse biased.

Figure 3:
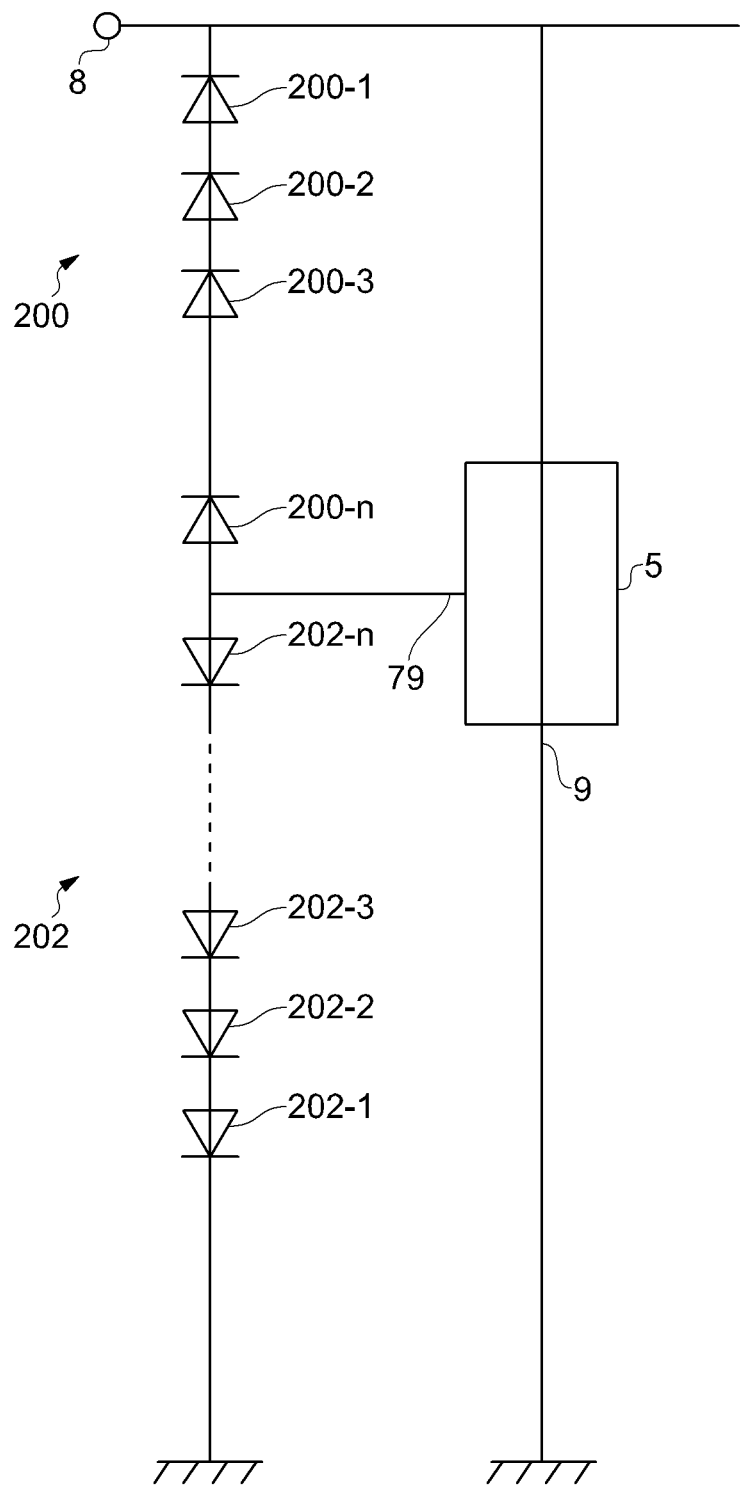
FIG. 3 is a circuit diagram schematically illustrating a trigger circuit for switching on the protection device after a voltage exceeds $\pm V_T$ ($V_T$=trigger voltage) at the node to be protected.

It follows that a stack of reverse biased diodes can be used to switch the protection device on once the overvoltage exceeds the combined breakdown voltage of the stack of diodes. Such an arrangement is shown in FIG. 3. Here diodes are arranged into two sub-stacks designated 200 and 202 respectively.

The first sub-stack comprises diodes 200-1, 200-2, 200-3 to 200-n, all arranged in the same current flow configuration, for example, the anode of diode 200-1 is connected to the cathode of diode 200-2, and so on.

The second sub-stack is similarly configured and comprises diodes 202-1 to 202-n. However the sub-stacks are arranged back to back such that if the diodes in one sub-stack are reverse biased, then the diodes in the other sub-stack are forward biased. The diodes have a relatively small leakage current when reverse biased that is too small to trigger the protection device 5 from operating but which ensures the voltage difference across each sub-stack is shared about equally by each of the reverse biased diodes therein.

It can be seen that once the magnitude of the voltage of the protected node exceeds the magnitude of the voltage that causes breakdown in the reverse biased sub-stack, then current flows to the control terminal 79 of the protection device, which is connected to a node between the sub stacks 200 and 202, with sufficient magnitude to cause the device to turn on. If the overvoltage event at the protected node 8 is a positive going event, then the first sub-stack 200 is reverse biased whereas the second stack 202 is forward biased. If the overvoltage event at the protected node is a negative going event, then the first sub-stack 200 is forward biased, and the second sub-stack 202 is reverse biased.

For each sub-stack 200 and 202 containing 'n' diodes, then the trigger voltage to switch on the protection device can be approximated as expressed in Equation 1.

$$V_T = \pm(nV_{rev} + 0.7n) \quad \text{(Eq. 1)}$$

In Equation 1, $V_{rev}$ represents the reverse breakdown voltage of each diode, and 0.7 represents the forward voltage drop across each forward biased diode. Other trigger circuits could be provided. Additionally or alternatively an internal trigger mechanism can also be used.

Figure 4:
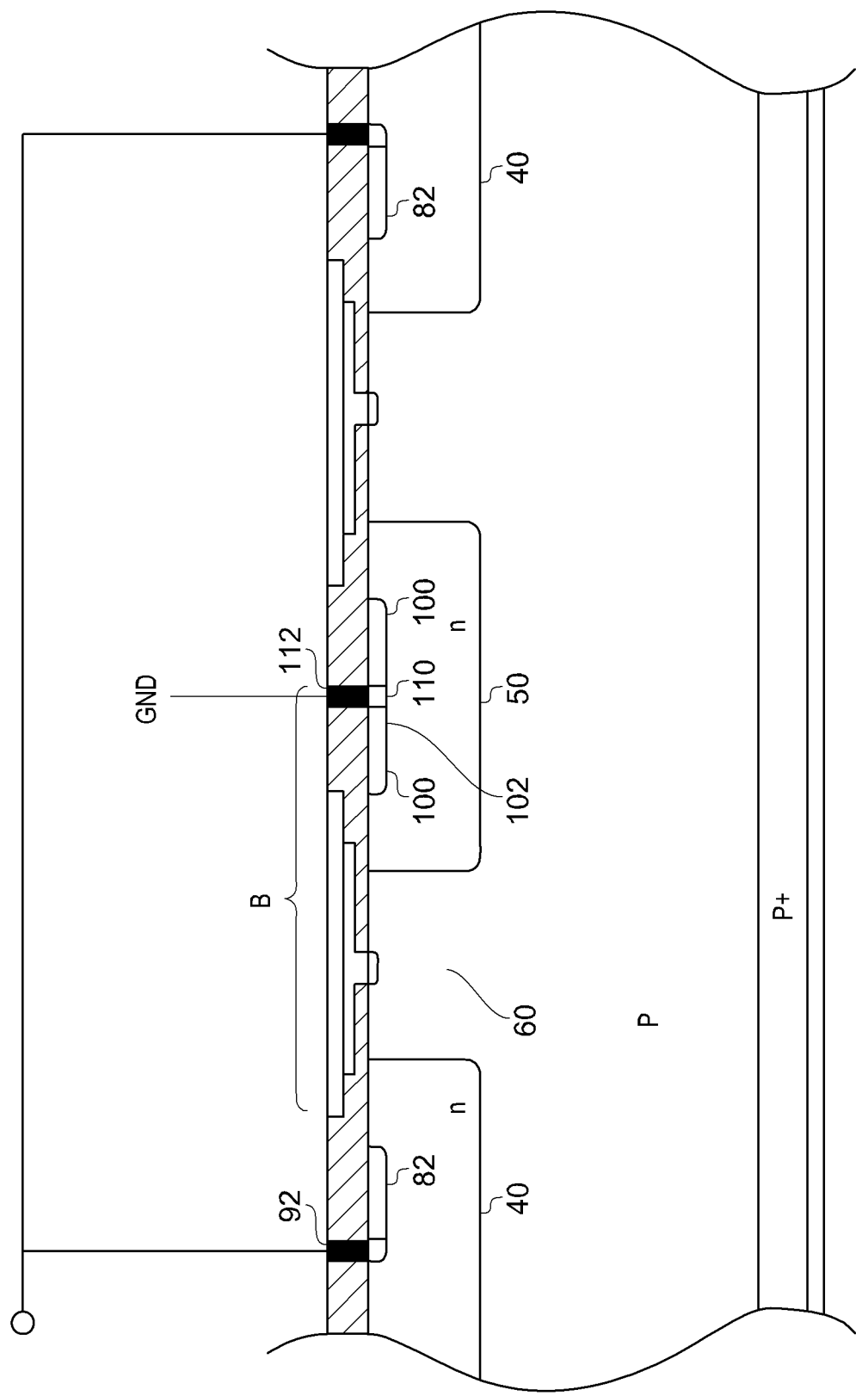

FIG. 4 shows a second embodiment of the invention, which is generally the same as that shown in FIG. 1, but with the addition of internal trigger structures. The edges of the device have been omitted for clarity. The internal structures are in the form of relatively shallow P-type extensions, which in a three-dimensional device, can form ring like structures or plate like structures. Thus the additional P-type region 80 of FIG. 1 can be extended to become a P-type punch-through control structure 82 that extends laterally in the first N-type region towards the P-type region 60. Similarly, the P-type region 100 of FIG. 1 is extended around the heavily doped N-type region 110 forming a plate like structure 102. The region of FIG. 4 generally designated B is shown in greater detail in FIG. 5.

It can be seen that the P-type punch-through regions 82 and 100 stop short of the nominal edge of their respective N-type regions 40 and 50 by a distance or spacing D. The distance D can be varied during the device fabrication process by mask positioning. The distance D controls the voltage at which punch through occurs and the protection device triggers. In experiments performed by Applicants for which test data is provided herein, the distance D has ranged from around 23 to 5 micrometers to provide trigger voltages of 250 volts down to 120 volts, respectively, for an embodiment of the protection device. The distance L from the edge on the N-type region to the N+ region 110 was 25 μm for the experiments. However, other dimensions are applicable and will be readily determined by one of ordinary skill in the art.

Figure 5:
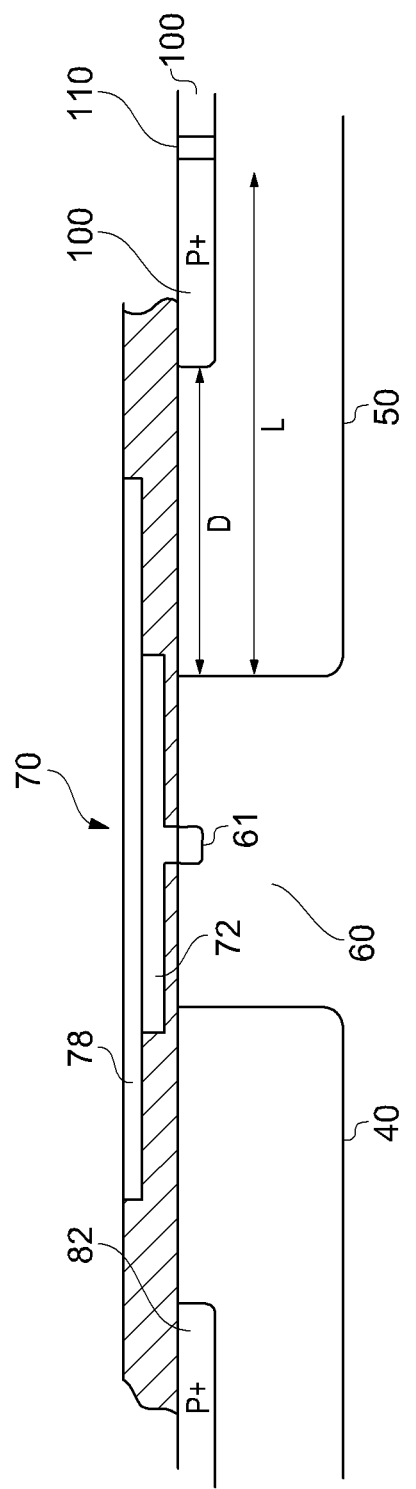
FIG. 5 shows part of the arrangement of FIG. 4 in greater detail.

FIG. 6 again illustrates the structures shown in FIG. 5, but also includes the depletion region boundaries 300, 310 with the N-type regions, for the condition in which no potential difference exists across the device.

As the voltage supplied at an input node 312 (region 40) becomes more negative, the depletion region boundary 300 moves rapidly towards the N-P boundary between regions 40 and 60, and the junction formed thereby starts to conduct. However, as the magnitude of the voltage increases, the depletion region boundary 310 moves to the right, as illustrated by arrow 316. The depleted N-type material is effectively P-type material, and hence the region 60 expands towards the P+ region 100. As the voltage increases further the depletion region moves further rightward, and eventually its uppermost edge moves past the left hand boundary 320 of the region 100. Now the extended base region 60 of P-type material is in direct contact with the P-type region 100, and this forms a resistive path which allows current to flow from the grounded electrode to the base of the NPN transistor via the region 100. Once current flow has initiated, the self latching nature of the silicon controlled rectifier within the protection device turns it hard on and holds it on.

As noted hereinbefore, the trigger voltage is adjusted by the relative distance between the edge of the punch through structure and the edge of the N-type region in which it is formed. Both of these positions are defined by masks during device fabrication and hence the trigger voltage is definable by device dimensions during the fabrication process.

Figure 7:
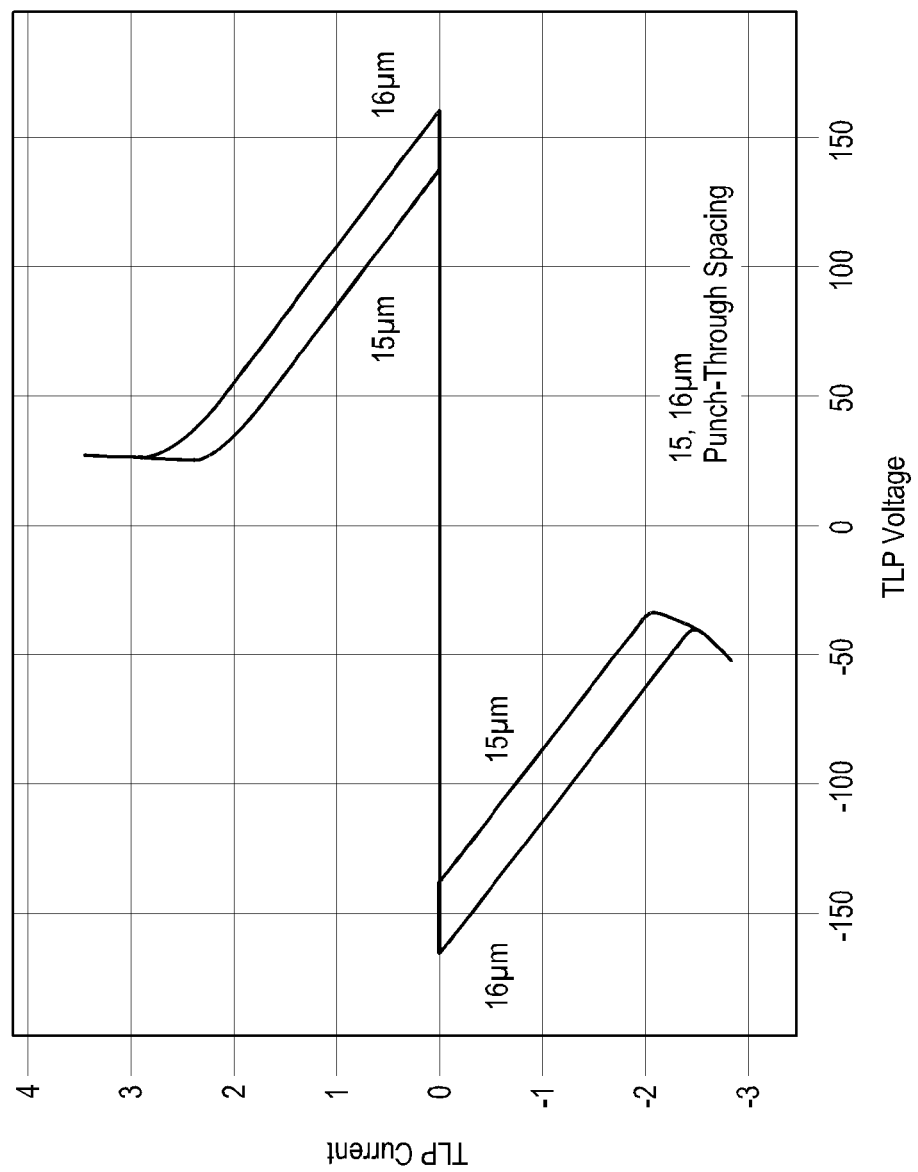
FIG. 7 is a graph showing positive and negative overvoltage punch-through based responses, wherein the trigger voltage is defined by manufacturer controlled spacings within the device.

FIG. 7 shows the performance is substantially symmetric for a device of the type shown in FIG. 4, for spacings D equal to 15 μm and 16 μm for positive going and negative going overvoltage events. It shows that for a spacing of 15 μm in the device under investigation the trigger voltage was about ±140 volts, whereas for 16 μm spacing the trigger was about ±160 volts.

The horizontal axis shows a TLP voltage whilst the vertical axis shown a "TLP" current. The "TLP" designation refers to an industry standard test in which the device is tested with 100 ns pulses of voltage, and the resultant voltage evolution and fall back current are measured. The duty cycle is relatively low so that device heating is not an issue.

FIG. 7 also shows another desirable characteristic to have with a protection device, namely that after triggering the voltage across the device need not fall to zero volts, but to a safe level. This "foldback" to a safe level is desirable as it can be set sufficiently high to stop the protection device trying to pull signal lines, or even power supply rails, down to zero volts. This will be discussed in greater detail later.

The ability to define the trigger voltage for the punch through based trigger mechanism is of significant value. It means that the manufacturer, by the use of spacings between the P-type base region 60 and the P-type punch-through regions 82 and 100, can readily control the trigger voltage of the protection device 5 during manufacture as the spacings are directly controlled by masks during the fabrication of the protection device 5.

Figure 8:
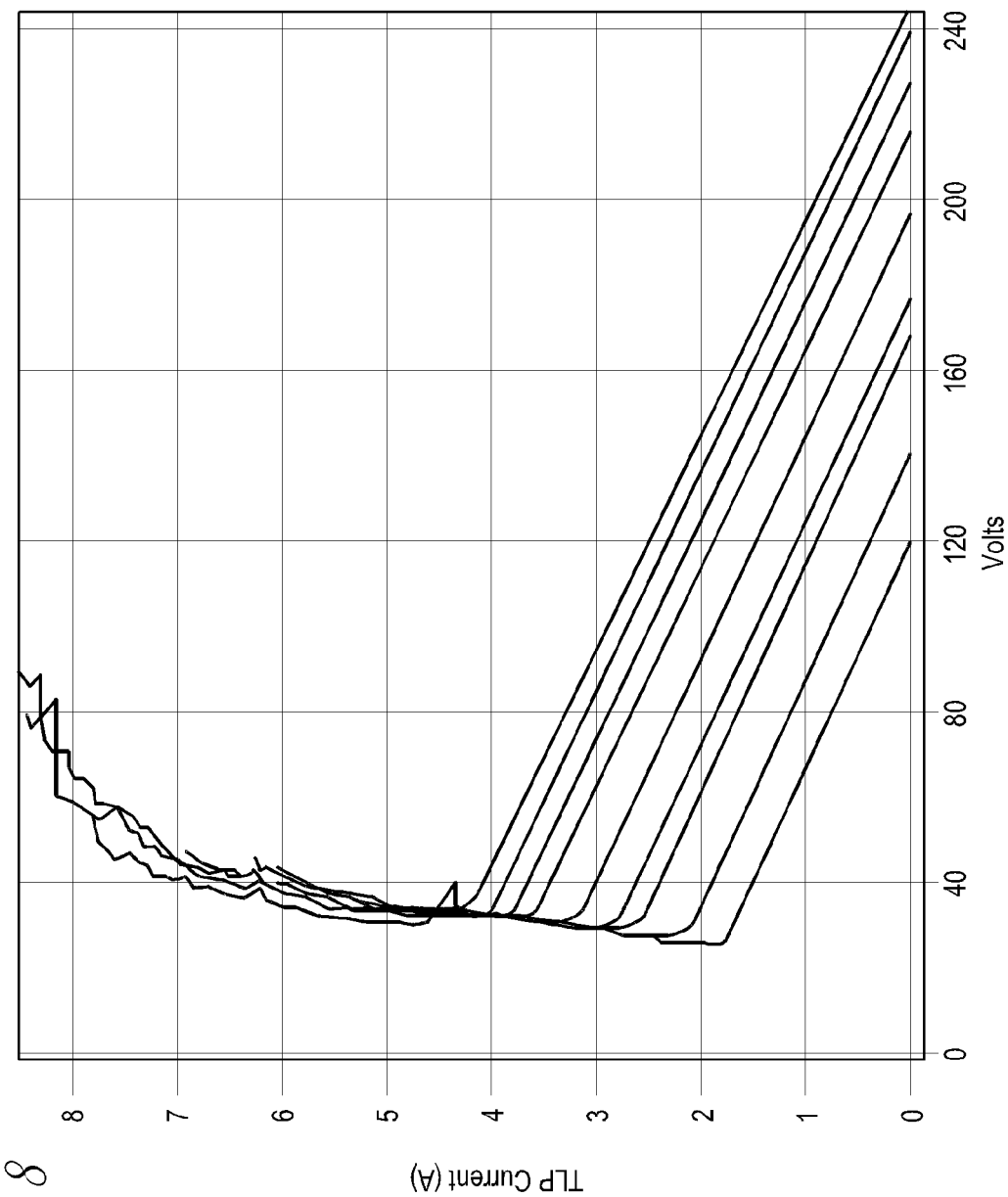
FIG. 8 is a graph showing a family of trigger voltages, wherein each trigger voltage is determined at least partly by the geometry of the device, and hence is under direct control of the device manufacturer.

FIG. 8 shows a plot of measured trigger voltage and device current for a series of TLP tests on devices constituting embodiments of the invention, for a device in which the distance L was 25 μm and the extent of the punch-through region ranged from 2 to 20 μm, and hence the spacing D ranged from 23 to 5 μm. As noted before, as the spacing D increases so does the trigger voltage.

For the sake of completeness, it is noted that the TLP tests work by charging a charge carrying body, whose capacitance is set out in the standard, to the test voltage. The capacitance of the body 31 is then related to the TLP current.

Finally, if punch-through is not relied upon as an internal trigger, and an external trigger is not provided, then impact ionization caused by increasing electric field at the base-emitter junction of the NPN transistor can also be used to turn the device on. This can also be controlled by doping levels and the spacing between regions of the device. In such an arrangement, the reverse biased collector base junction initiates impact ionization that injects a current into the base. As the base charges, it forward biases the emitter that turns on the NPN transistor. The NPN transistor then feeds into the PNP transistor and the SCR is triggered. The point at which impact ionization is started is controlled with the lateral spacing of the regions 40 and 50, in addition to the field plate 70 or conductive layers 72, 78 that overlap of the regions 40 and 50, that is, larger layout spacing provides a higher trigger voltage. The base is connected to a current flow path via a resistance.

In one embodiment, the symmetric nature of the protection device allows a single device to provide overvoltage protection against positive and negative going overvoltage events. This contrasts the device with prior art overvoltage protection devices which are generally effective only for one direction of threat, for example only against positive overvoltage events. However, for a self triggered mode, the device needs to be "wired" correctly, and in a way which is different from that which a person skilled in the art and with knowledge of the approaches employed in the art would expect.

FIGS. 9a and 9b show a way of connecting the bipolar transistor based overvoltage protection device such that it is responsive to only one direction of overvoltage threat. As can be seen, conventionally the P-type base region is connected to the emitter region (right hand most N-type region shown in FIGS. 9a and 9b), and both these regions are connected to ground.

With such an arrangement, when the left hand N-type region 340 is taken positive, for example to 150 Volts, then the depletion region boundary 341 moves away from the PN junction between the depletion region 340 and the P-type body of the device. Thus, the device does not conduct until such time as the punch through or ionization mechanisms operate to turn the device on. If, for simplicity it is assumed that a forward biased diode drops about 1 volt, then the bias voltage across the PN junction is about 149 V.

However, when the voltage is attempted to be taken negative (as may actually occur in normal operation of the circuits to which the protection device is connected) then the junction starts conducting as soon as the voltage exceeds 1 volt. Hence the device fails and goes conducting too early when presented with a negative polarity overvoltage event.

Figure 10A:
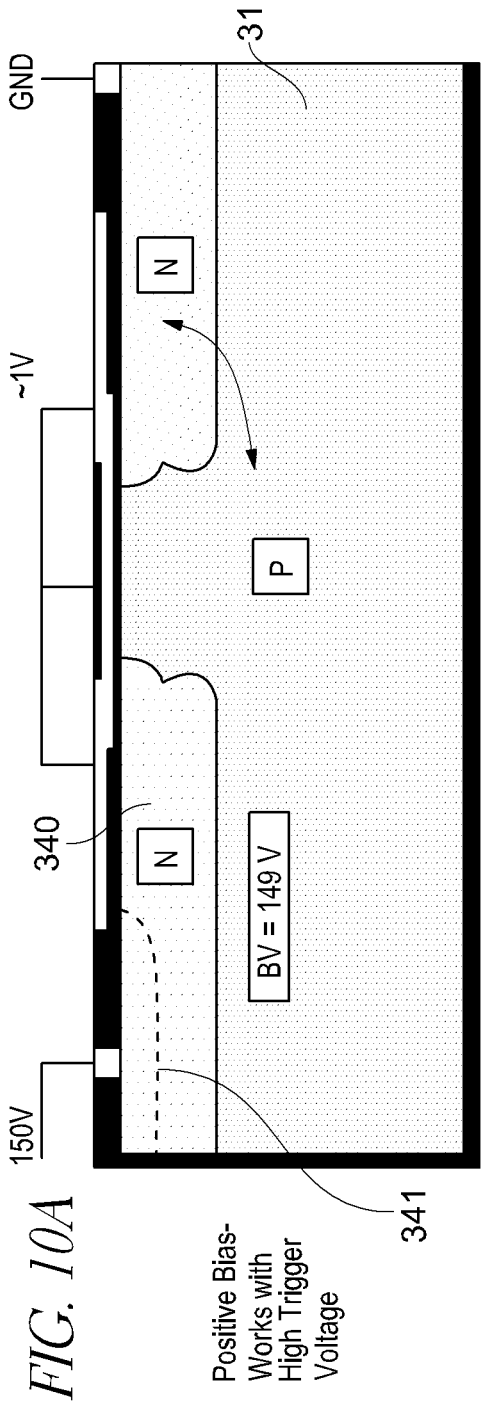
FIGS. 10a and 10b illustrate how an embodiment of the invention provides overvoltage protection for both polarities of overvoltage threat.
Figure 10B:
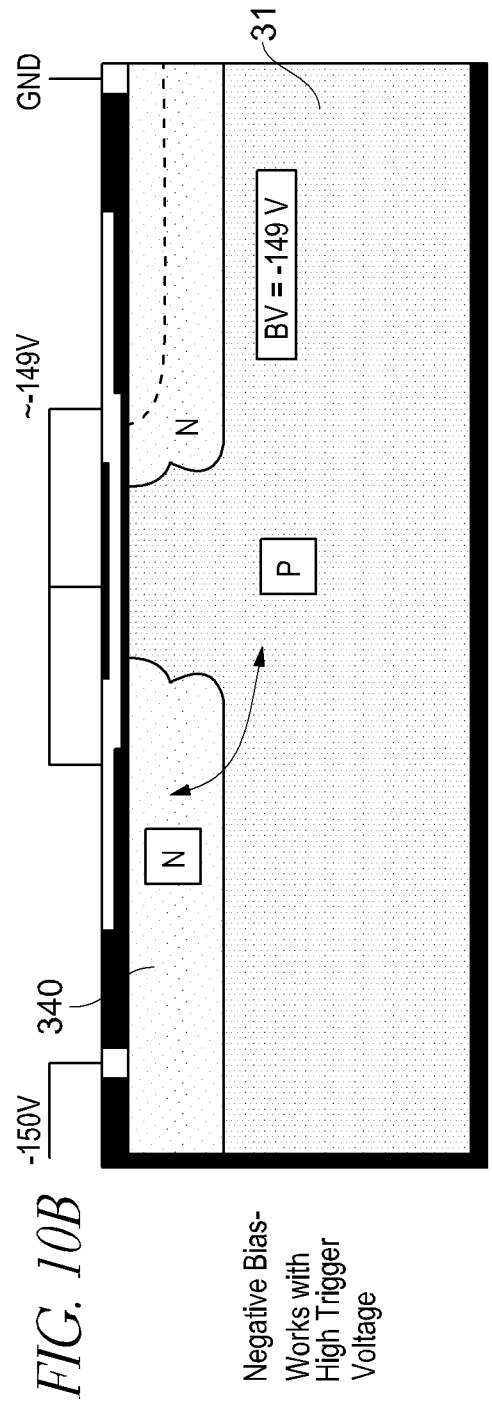

In the arrangement shown in FIGS. 10a and 10b the base of the protection device goes to an internally generated potential as determined by the relative connections of the PN junctions, and this potential is connected to the field plates.

Now, when presented with a positive going overvoltage, the base floats to 1 V (one diode drop) above the ground voltage connected to the right hand side N-type region, and hence as before a reverse biased P-N junction is formed in the left hand side N-type region, until such time as the voltage rises sufficiently to trigger the protection device 5.

Turning to FIG. 10b, when a negative going voltage is presented, the P-N junction between the depletion region 340 and the body 31 becomes conducting, and hence the body voltage now drops to −149 V. However, since the base is not grounded, this enables a reverse biased region to form between the body 31 and the right hand side N-type region. This inhibits current flow until such time as the voltage magnitude exceeds a trigger threshold magnitude. Thus the device now remains non-conducting until the overvoltage threat of either polarity exceeds the trigger voltage magnitude.

Switching the Protection Device Back to a High Impedance State

In embodiments in which the protection device is actively driven by another circuit, then a timer and additional circuitry can be provided to force the protection device into an off state.

In embodiments in which, for example, the device initiates its own conduction via punch through, then other steps can be taken to control the protection device's foldback voltage, and ultimately to switch the protection device off.

Figure 11:
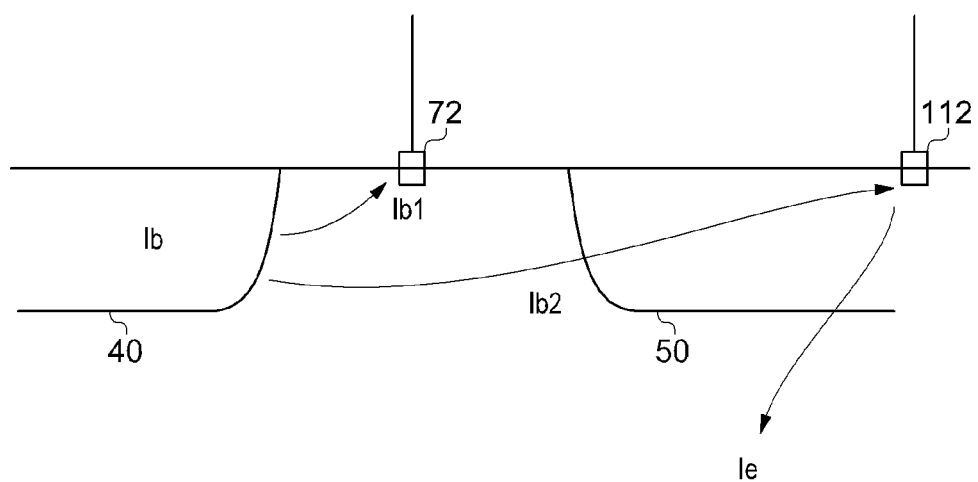
FIG. 11 illustrates how a base current splits within a protection device according to one embodiment of the invention.

FIG. 11 schematically illustrates current flow from region 40 (which in this example can be regarded as a collector) to region 50 (which can be regarded as the emitter) via the base.

The base current Ib can notionally be split into two parts Ib1 and Ib2, with some of the current (Ib1) exiting by way of the enhanced P-type doped region and the conductive layer 72 of the field plate for the base region (in conjunction with the field plate 70) and some (Ib2) exiting via the emitter contact 112.

Figure 12:
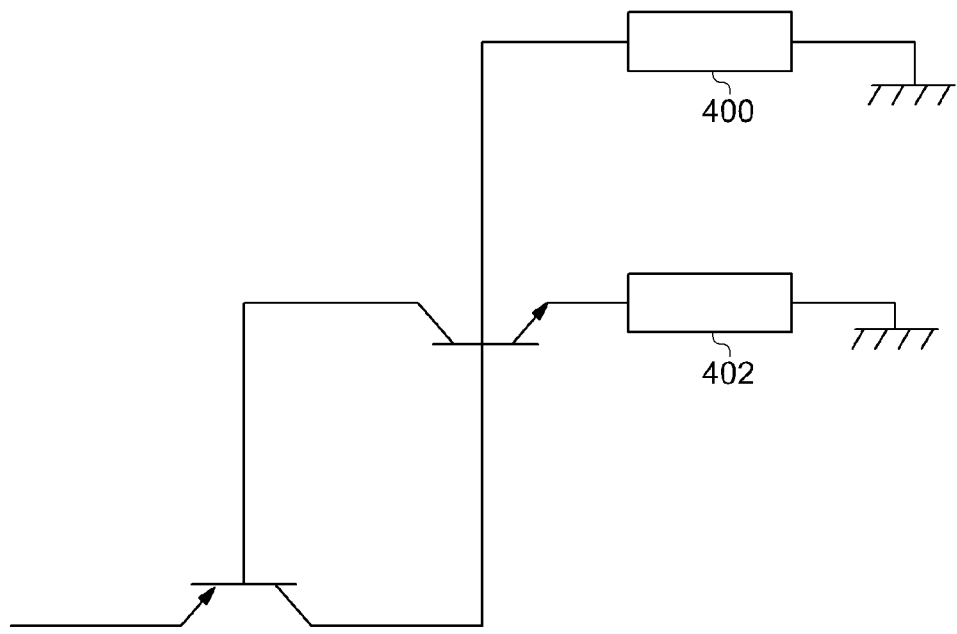
FIG. 12 schematically illustrates an equivalent circuit for a protection device.

The ratios between Ib1 and Ib2 can be varied by the provision of external impedances 400 and 402 which as shown in FIG. 12 can be regarded as base and emitter impedances, respectively. The proportion between the current flows can make the device's snap back response vary between being wholly silicon controlled rectifier like (when no current flows via the base) to being diode like when all the current flows via the base.

This ratio varies the holding voltage of the device, and hence gives a way for the designer to modify its snap back performance. The resistances (or impedances) should be able to withstand the overvoltage event, and this tends to suggest that the resistances should be formed of metal. However metals are relatively low resistance, and hence the length of the conductor used to form the resistor can become relatively large (in integrated circuit terms). This means that steps should be taken to confine the spatial extent of the metal resistors.

Figure 13:
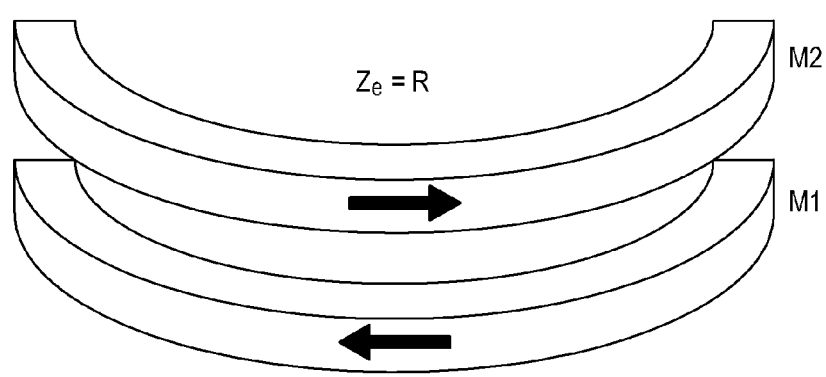
FIG. 13 shows how a resistor can be fabricated.

FIG. 13 schematically illustrates how relatively high resistance value metal film resistors can be formed in an integrated circuit, by winding them into spiral coils to save on die area. A coil exhibits inductance, so if a mainly resistive impedance is desired, then two coils can be formed in a superimposed relationship with the current therein flowing in opposite directions to cancel the magnetic fields, and hence the inductive characteristics, out. This allows the designer to vary the resistance and the inductance of resistors formed from spiral metal tracks.

In experiments, the holding or snap back voltage can be controlled by varying the relative values of a base resistor 400 and an emitter resistor 402.

Table I tabulates those results in which the base resistor 400 was formed with a nominally constant value Rb of 37Ω and the emitter resistor 402 had its resistance Re varied between 3.2 and 125Ω. It can be seen from the result that the holding voltage becomes increased as the value of the Re increases.

TABLE I

| $R_e$ | $R_b$ | $V_H$ |
|---|---|---|
| 3.2 | 37 | 90 V |
| 20.8 | 37 | 125 V |
| 89 | 37 | 145 V |
| 125 | 37 | 240 V |

Figure 14:
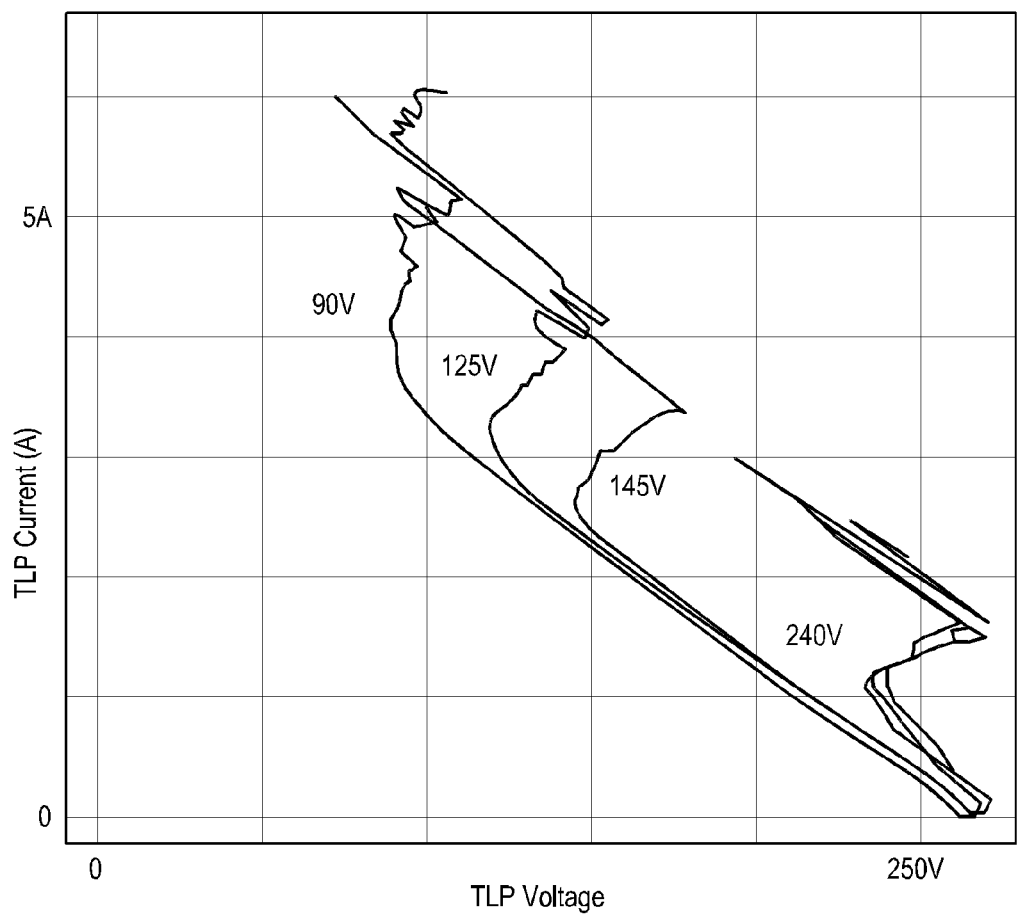
FIG. 14 is a graph showing holding voltage responses.

The results of the measurements using the Rb and Re values on a protection device having a trigger voltage of nominally 270 volts are shown in FIG. 14.

FIG. 14 illustrates that rather than trying to pull the voltage across the terminals of the protection device down to zero after the device has been triggered, the voltage reduces down to the holding voltage VH and varies around that level.

The inductive properties of the metal spiral can also be used to distinguish between the fast transient properties of an overvoltage event and the DC power supply. For example, if a metal spiral configured to generate inductance is placed at the base terminal and an ohmic resistor with substantially zero inductance is placed at the emitter terminal, a high speed transient event sees high impedance at the base relative to the emitter. This supports a SCR action and hence have a low holding voltage and a high ESD strength. However, once the transient event has ended, the DC power supply sees a relatively low impedance at the base relative to the emitter, this configuration supports a diode action and results in a relatively high holding voltage that switches off the device and prevent the power supply from keeping the SCR on and sinking a current. A similar circuit configuration can be achieved with a capacitor by using the transient dependent nature of the capacitor impedance to filter fast overvoltage events. The use of wound resistors and the resulting inductance thereof can also be used to control the rate of current build along the current paths Ib1 and Ib2. This means that the holding voltage can be controlled to evolve with time.

The value of the base resistance Rb may also be modified by electronic circuitry, such as by using field effect transistors to selectively control current flow from the base, or the potential at the base.

Figure 15:
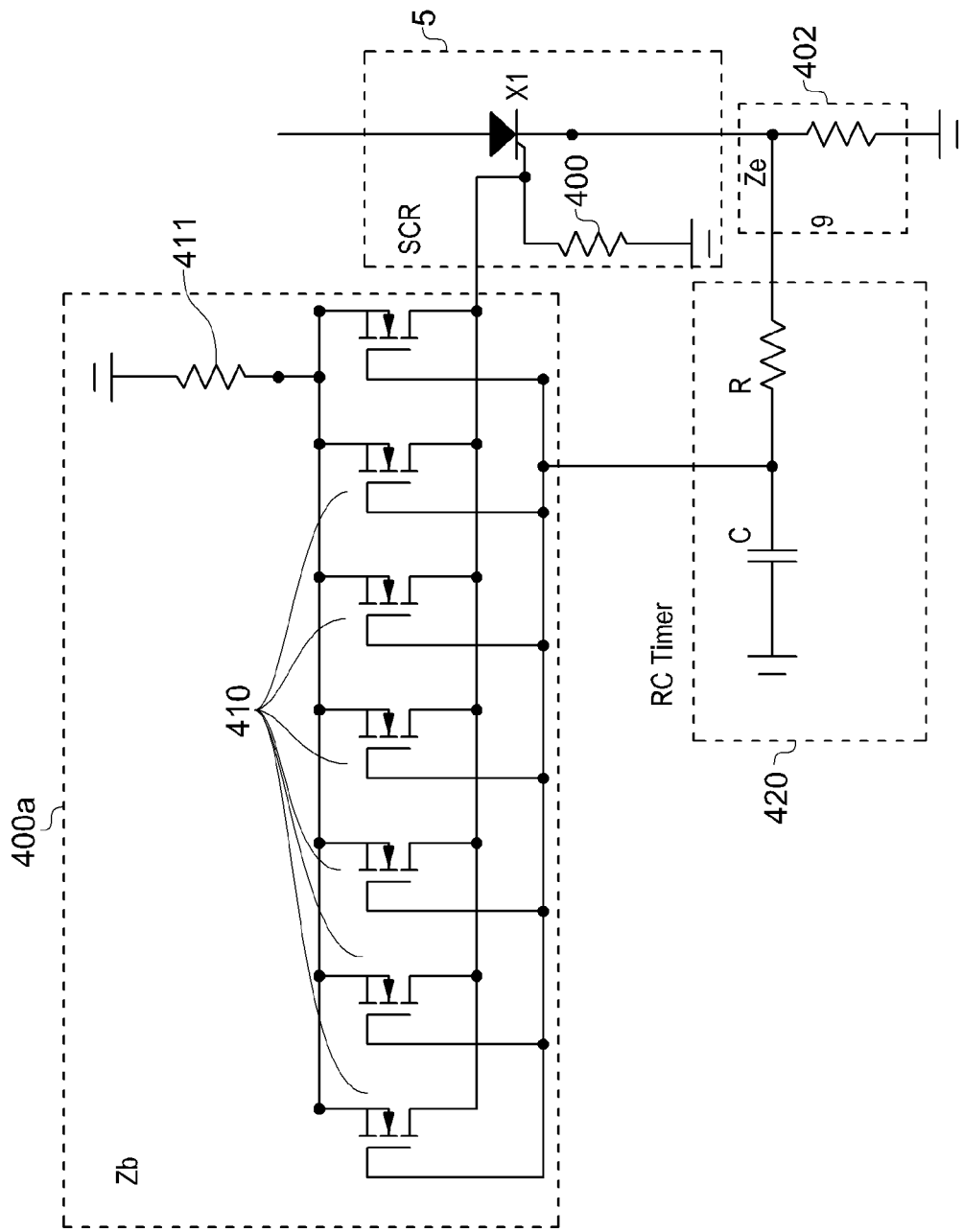
FIG. 15 is a circuit diagram showing a circuit for actively switching the protection device into a non-conducting state.

FIG. 15 shows an arrangement where the protection device 5 of FIG. 4 is implemented using a silicon controlled rectifier, and is associated with an emitter resistance Ze, formed by the emitter resistor 402. A base impedance is formed by the parallel combination of the base resistor 400, and a plurality of transistors 410 arranged in parallel between the base electrode and ground, with a small protective series resistor 411.

Gates of the transistors 410 are connected to a timer 420 formed by an RC circuit, where R is large (around 1 or 2 M ohm in an example circuit) and C is small (several pF).

After the protection circuit is triggered the current through the emitter resistor 402 causes the voltage across the resistor to rise, causing it to charge the capacitor of the RC timer via the resistor R. Once the voltage on C has risen sufficiently to turn the transistors 410 on, they pull the base (control terminal) to ground switching the protective device back into a high impedance state. This circuit is active against only one direction of an overvoltage threat, so needs reproducing to deal with the opposing polarity of threat.

Figure 16:
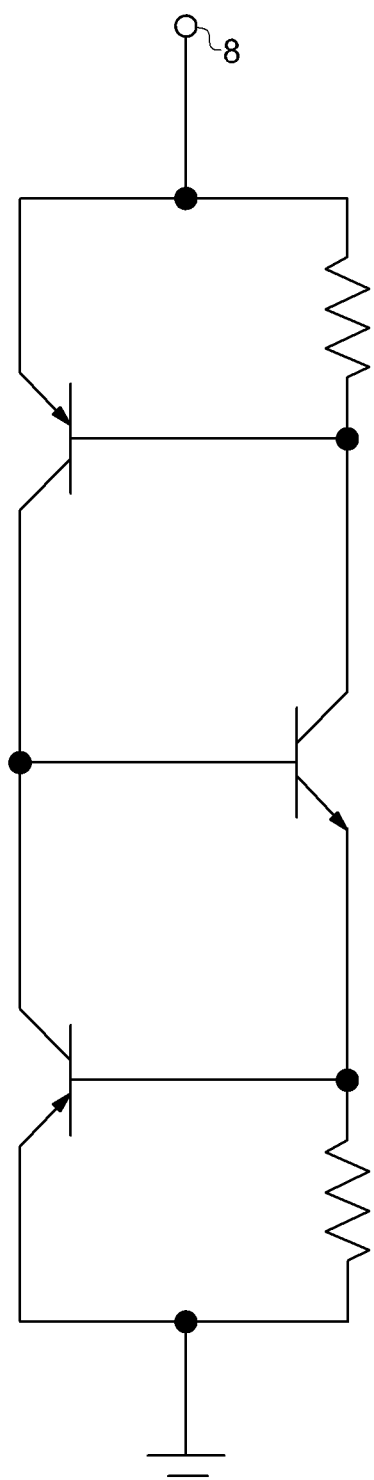
FIG. 16 is an equivalent circuit for the protection device.

Although the protection device has, for simplicity, been described as looking like a silicon controlled rectifier, due to its bi-directional nature, and the formation of vertical P-N-P transistors in the region 40 and 50 of N-type material gives rise to a more symmetric structure whose equivalent circuit is shown in FIG. 16. It can be seen that if the protected node is exposed to a positive going threat, then the NPN and the uppermost PNP transistor form a silicon controlled rectifier, and the lowermost PNP transistor is reverse biased so acts as a high impendence. If the protected node 8 is exposed to a negative going overvoltage threat, then the NPN transistor and the lowermost PNP transistor form a silicon controlled rectifier, an the uppermost PNP transistor is reverse biased.

Figure 17:
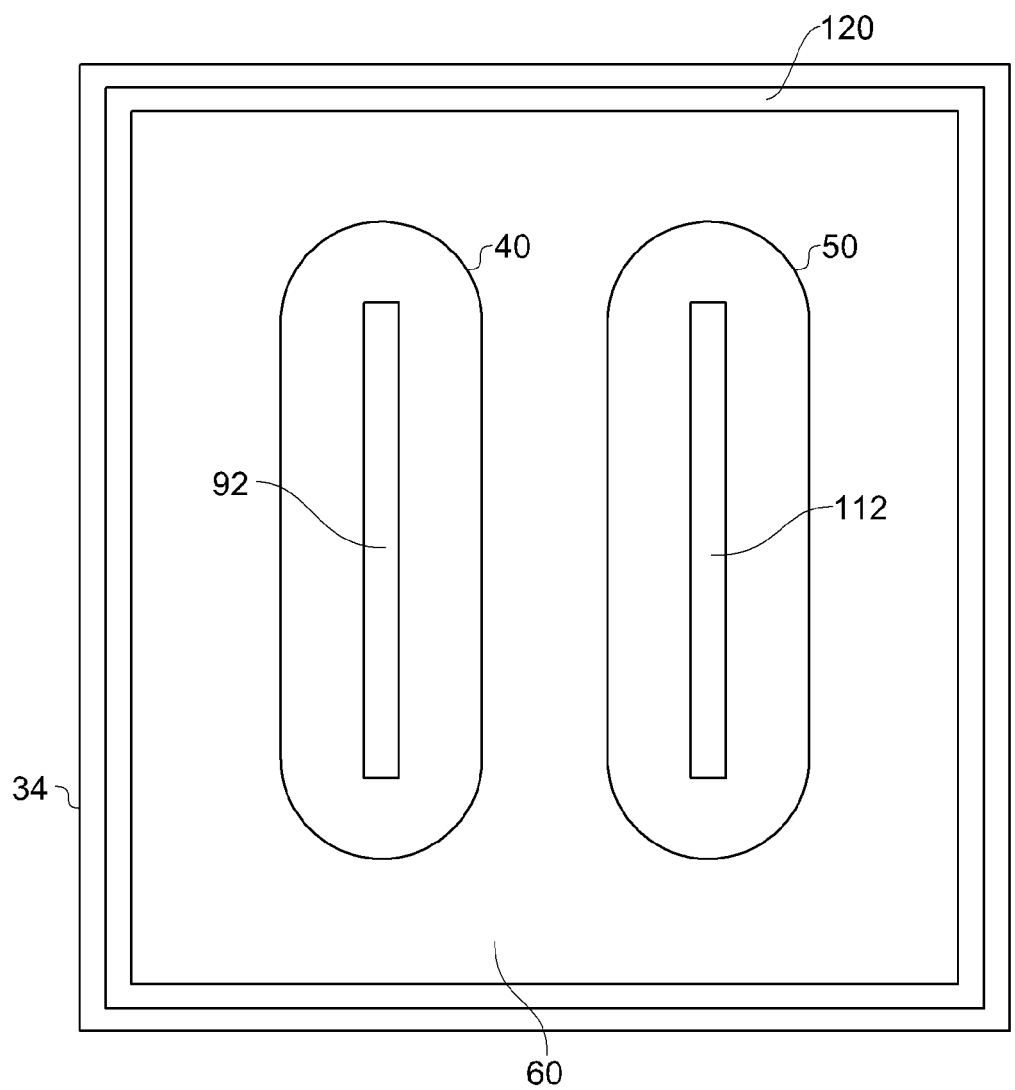
FIG. 17 is a plan view of an alternative construction of a device constituting an embodiment of the invention.

FIG. 17 shows in plan view an alternative configuration of the devices of FIGS. 1 and 4. However instead of making the device have two (or more) fold rotational symmetry, instead the first and second N-type regions 40 and 50 are formed as adjacent linear structures separated by the P-type base region 60. This configuration makes for a more compact device compared to the arrangement shown in FIG. 2. Only the doping regions have been shown, and it follows that field plates 70 and 70a are provided (not shown) as described hereinbefore.

It is thus possible to form a protection device that has one or more of the following properties: it gives overvoltage protection against positive going and negative going overvoltage events; it has a trigger voltage that is controlled by the geometry of the device; it has a controllable holding voltage; and it can be provided using commonly available processing steps.

It should be noted that although the device has been described in terms of a lateral N-P-N transistor, the N and P regions can be reversed to make a PNP transistor. However PNP transistors are generally not favored for overvoltage protection due to the reduced carrier mobility of holes compared to electrons.

Figure 18:
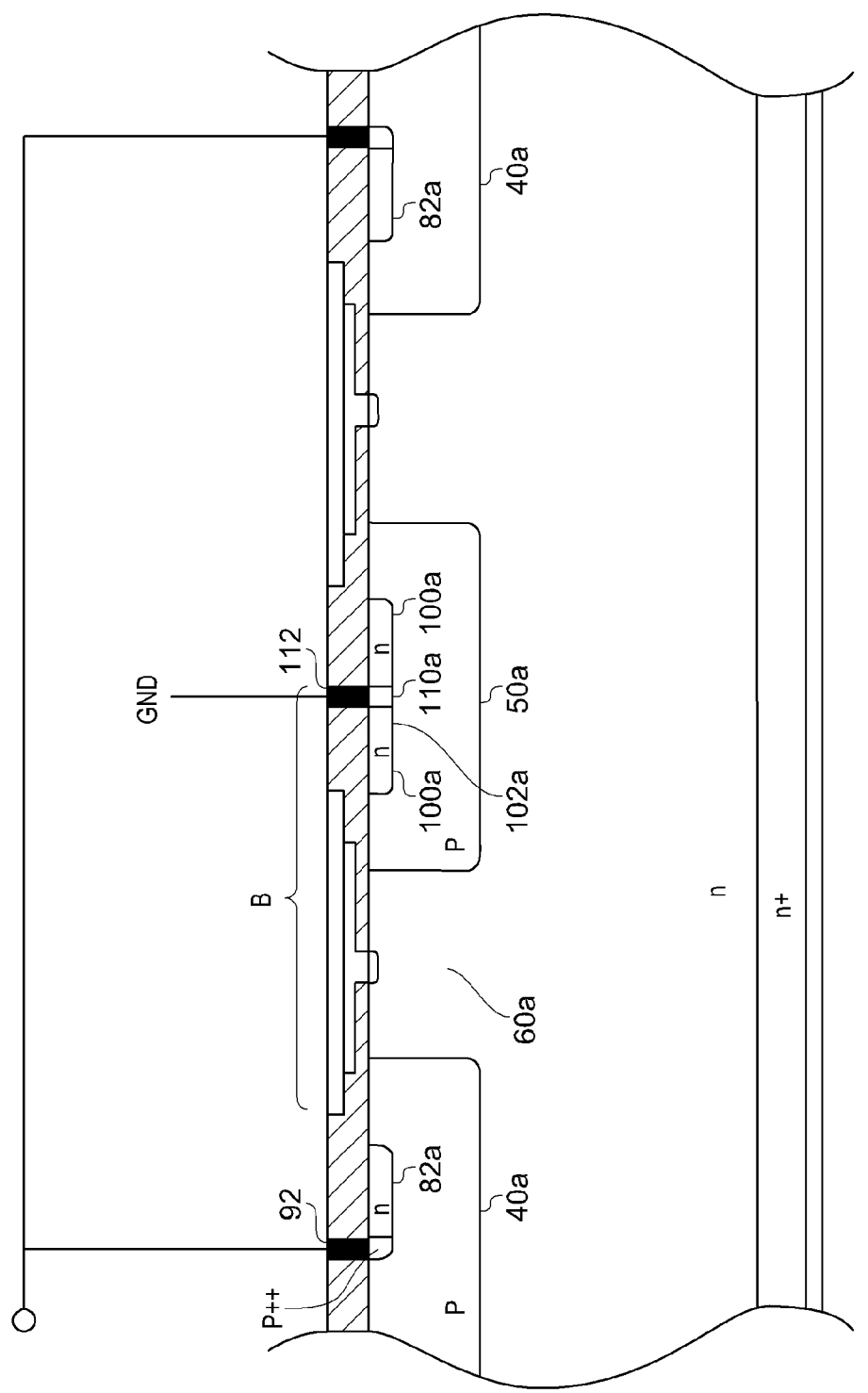
FIG. 18 is a cross section through a further embodiment of a protection device that is similar to that shown in FIG. 4.

Such an arrangement, in which the embodiment of FIG. 4 has been modified such that the N-type regions become P-type regions and the P-type regions become N-type regions is shown in FIG. 18.

In FIG. 18, like parts have been designated with a like reference numeral, except appended with an "a" to signify that the dopant type has been swapped from P-type to N-type or vice versa, with respect to FIG. 4.

Figure 19:
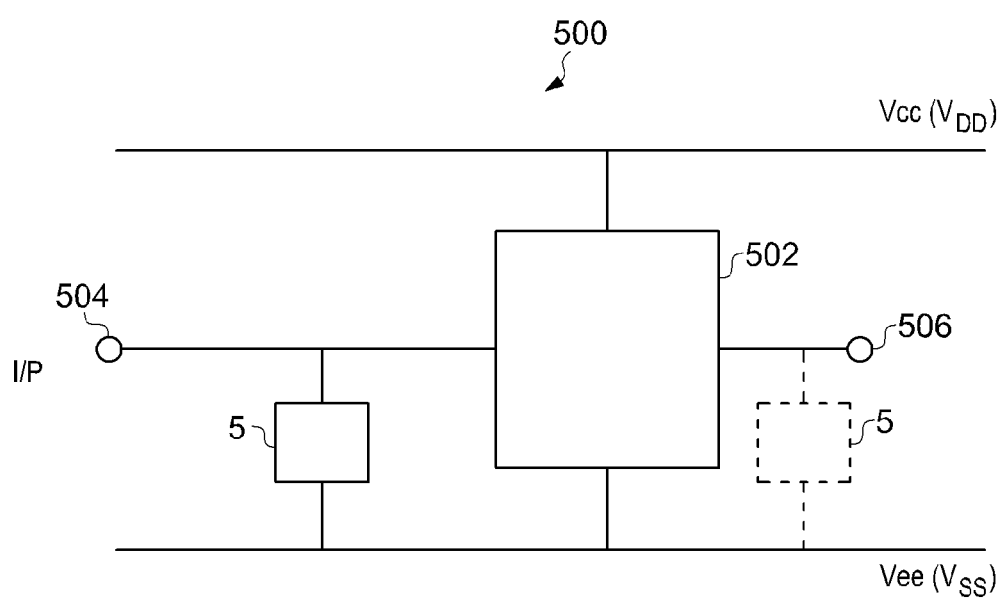
FIG. 19 is a circuit diagram of a monolithic integrated circuit including a protection device constituting an embodiment of the invention.

FIG. 19 schematically illustrates a monolithic integrated circuit, generally designated 500 in which a semiconductor circuit 502 has an input node 504 and an output node 506. The input node is protected by a protection device 5 as described hereinbefore which extends between the input node 504 and a power supply rail such as Vee in the context of bipolar junction transistor circuitry or Vss in the context of a field effect transistor circuit. The output node 506 may optionally be protected by a further protection device shown in dotted outline, although given that output circuits are generally low impedance they are much less susceptible to electrostatic damage than input circuits which often have a very high input impedance and deliberately small input capacities in order to achieve a good operating bandwidth of the circuit 502.

Device packaging, layout or circuit connections may have an influence on device performance under certain conditions.

Figure 6:
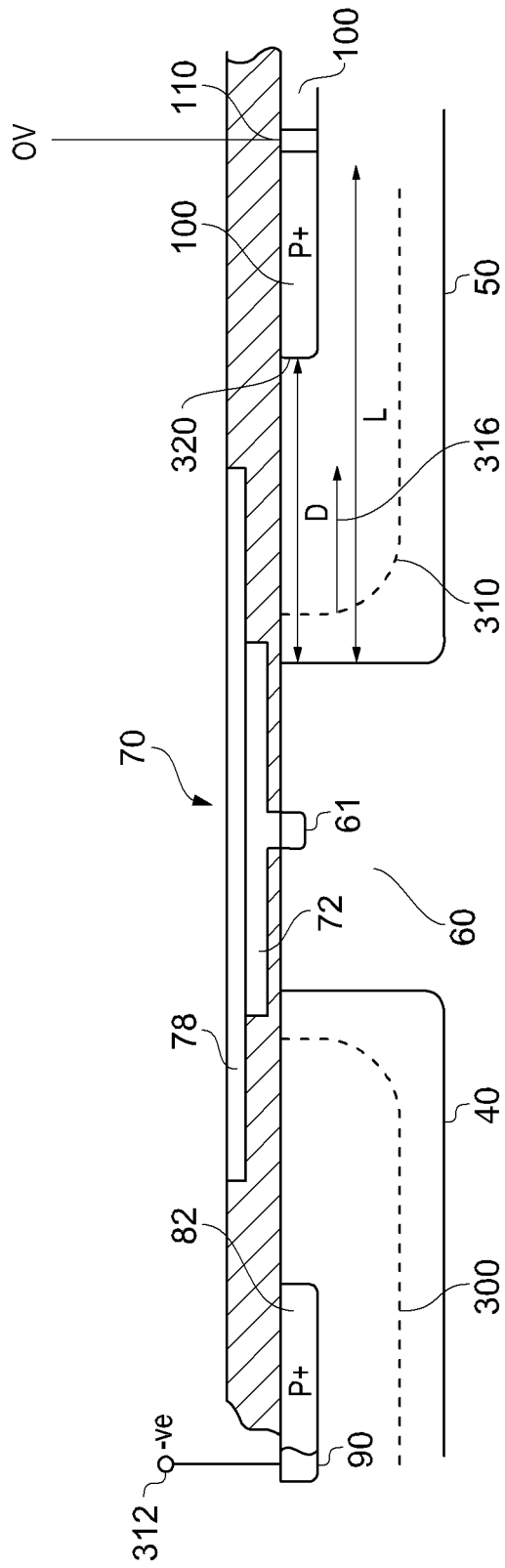
FIG. 6 schematically illustrates depletion region boundaries within the part of the arrangement illustrated in FIG. 5.

As discussed hereinbefore, the trigger voltage can be adjusted or can be set by the relative spacings between doped regions within the device, as shown in FIG. 6. Some of these regions are relatively heavily doped, and consequently can have relatively large capacitances (compared to a standard region within a transistor of comparable size). These capacitances may enable very fast transient events, or events with a large slew rate, to induce capacitive based current flow within the overvoltage protection device that modifies its trigger voltage for a short period of time.

Figure 20:
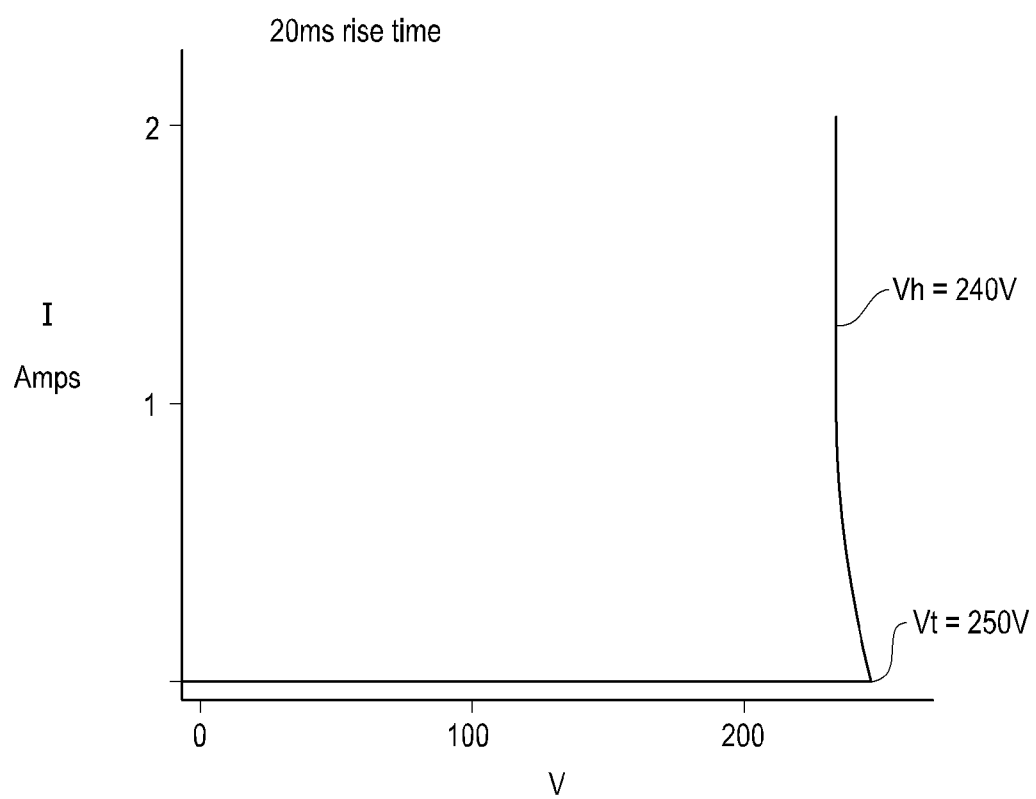
FIG. 20 is a plot of break-down voltage versus current flow for a protection device as described hereinbefore, having a nominal threshold voltage of 250V, in response to an overvoltage event having a 20 millisecond rise time.
Figure 21:
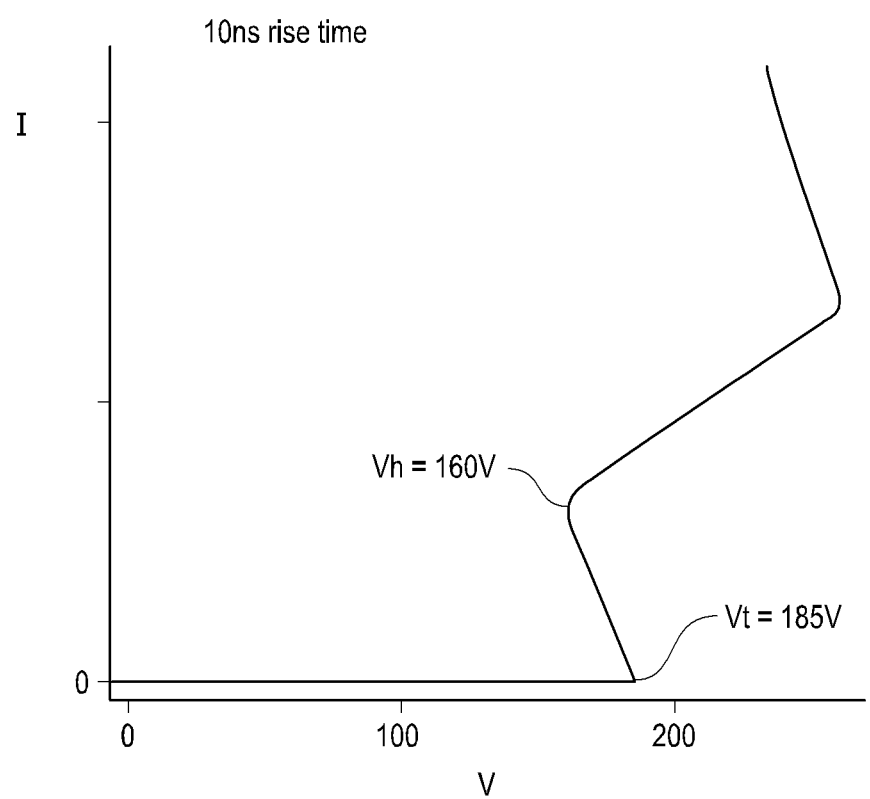
FIG. 21 is a plot of break-down voltage versus current flow for the same device as was tested in FIG. 20, but in response to an overvoltage even having a 10 nanosecond (ns) rise time.
Figure 22:
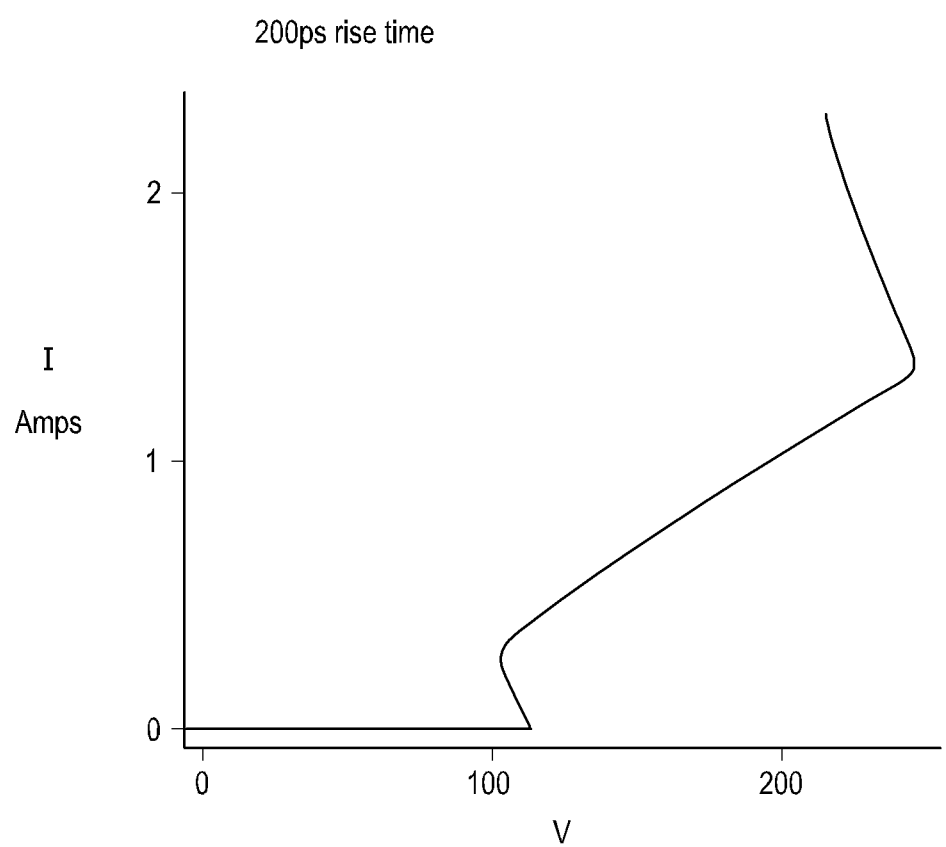
FIG. 22 is a plot of break-down voltage versus current flow for the same device as was tested in FIG. 20, but in response to an overvoltage event having a 200 picosecond (ps) rise time.

FIGS. 20, 21 and 22 compare the performance of a device undergoing a TLP test in which the rise time has been controlled. The device has a DC performance of a threshold of 250 V and a holding voltage of 240 V.

In response to a slow overvoltage event shown in FIG. 20, in which the rise from 0 V to the trigger voltage occurred in several milliseconds, the response was the same as the DC case. However, as the rise time becomes shorter—and hence the frequency components within the transient event increase in frequency and, for a given voltage of overvoltage event the slew rate also increases, experimental evidence shows that under some conditions the trigger voltage and the holding voltage may become reduced.

FIG. 21 shows the response of the same device but in response to an overvoltage event having a 10 nanosecond rise time. The trigger voltage was initially reduced to 185 V and the holding voltage to 160 V, although both these values recovered as the leading edge of the overvoltage event passed and hence the high frequency components associated with a rapidly rising voltage also diminished.

FIG. 22 shows the response of the device to an overvoltage event having a 200 picosecond rise time. The trigger voltage Vt was reduced to 122 V and the holding voltage was reduced to 115 V, but again they recovered to the DC value once the transient passed.

However, it is desirable for the overvoltage protection device to have a reliable threshold voltage irrespective of the rise time of the overvoltage event.

It was noted hereinbefore that inductive properties of the metal spiral that is used to form the base and emitter resistors can be exploited to transition the operation of the protection device between SCR like and diode like responses in response to a fast transient overvoltage event. It was also suggested hereinbefore that capacitance could also be used to provide a filter against fast transient events.

FIG. 23 shows a circuit diagram in which the overvoltage protection device 5 as described hereinbefore and represented by a protection device 600, which corresponds to the equivalent circuit shown in FIG. 16, is placed between a node to be protected 8 and a negative supply rail or ground 610, which represents a discharge node because current is discharged to it by the protection device during an overvoltage event.

An emitter resistor 402 extends between the second node 9 of the protection device 5 and the ground 610. A base resistor 400 extends between the base terminal 79 and ground 610. The base terminal acts as a control node for the overvoltage protection device.

In order to provide a high pass filter to ground against fast transient events, or at least the very high frequency components associated with a near step change in voltage at the protected node 8 resulting from a rapidly changing event, a capacitor 620 is provided between the protected node 8 and ground 610. The capacitor 620 corresponds to a real capacitor and to more than mere parasitic capacitance. The capacitor 620 can have a relatively small capacitance, typically of 10 to 20 pF and can be internal to the overvoltage protection device. A larger amount of capacitance may be used. The larger capacitance may be provided as an external component. However in such an arrangement it has to be connected in such a way as to provide a low impedance path for fast transients. Of course, for design purposes, parasitic capacitances should also be taken into account when determining how much capacitance the capacitor 620 should provide.

As opposed to providing a traditional capacitor 620, the capacitor 620 can be implemented via the parasitic capacitance of a semiconductor device, such as the parasitic capacitance of a reverse biased diode 630 between the node 8 and ground 610 as shown in FIG. 24. However, it will be understood that the capacitor 620 does not correspond to mere parasitic capacitance because a component is being added to provide the extra capacitance.

Figure 25:
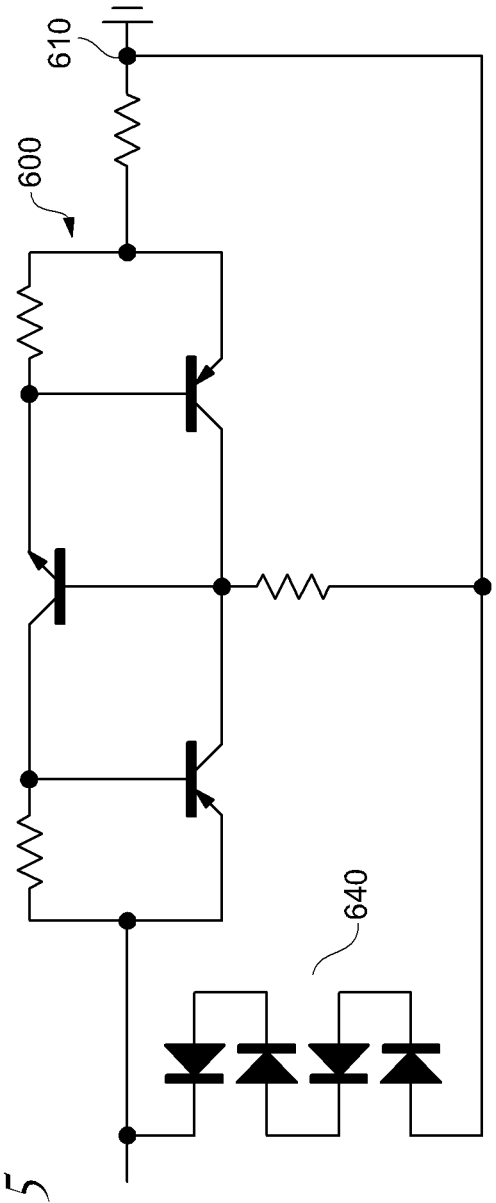
FIG. 25 is a circuit diagram of a arrangement in which a protection device is associated with a diode stack.

As shown in FIG. 25, the single diode 630 may be replaced by a plurality of diodes arranged in a stack 640. Each diode is normally reverse biased, so the stack can exhibit a large break down voltage. Furthermore, as the capacitances of the reverse biased diodes are connected in series, this allows the stack to have an effective capacitance which is significantly less that that of a single diode. It should be noted that this configuration provides a filter for high frequencies which is similar to that shown in FIG. 3.

The use of the capacitor 620 as shown in FIG. 23 provides a symmetric response to overvoltage threats, that is the protection device can respond to both positive going and negative going overvoltage conditions, whereas the unidirectional current flow nature of a diode 630 or diode stack 640 may make the circuit only suitable for providing protection against a single polarity of overvoltage threat.

The capacitance provided at the input node varies as $Z=(jwc)^{-1}$ where w is angular frequency, c is capacitance and $j=(-1)^{1/2}$. This "imaginary" impedance may present an unwanted loading at the protected node 8.

Similar high pass filtering responses can be achieved by adding capacitance between the base 79 (the control node) of protection device and ground, as shown in FIGS. 26 and 27 in which a capacitor 620a and diode 630a, respectively, are provided between the base 79 and ground 610, and since a base resistor 400 has been provided in this example, are in parallel with the base resistor 400. This arrangement may present less of a frequency dependent load on the node 8.

Figure 28:
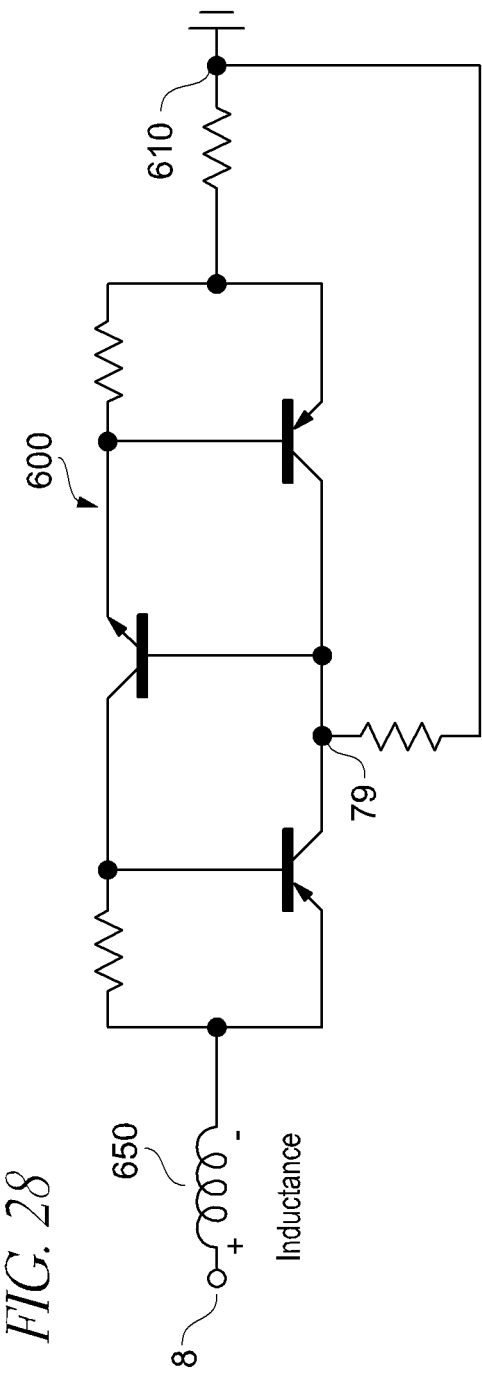
FIG. 28 is a circuit diagram for a combination of a protection device in combination with a series inductor.

In a further variant, an inductor 650 may be provided in series with the protection device, as shown in FIG. 28. While the inductor 650 can include parasitic inductance, the inductor 650 corresponds to a real inductor and not merely to parasitic inductance. The inductor 650 provides an impedance that varies as Z=jwL, where L is the inductance of the inductor 650, and hence the impedance is proportional to frequency. As the protection device 600 exhibits a mixture of resistance and capacitance, it cooperates with the inductor 650 to form a high stop (low pass) filter that limits effect of the high frequency components of a fast transient event. The inductor 650 can be placed downstream of the protected node 8, as shown in FIG. 28, or upstream of it. The inductor 650 may be formed as a specific component within an integrated circuit or depending on the value required may be provided as part of the parasitic inductance of package pins and bond wires associated with an integrated circuit.

It is thus possible to provide a filter in association with an overvoltage protection device to modify the operation of the protection device in response to high frequency transients.

Figures 29A, 29B:
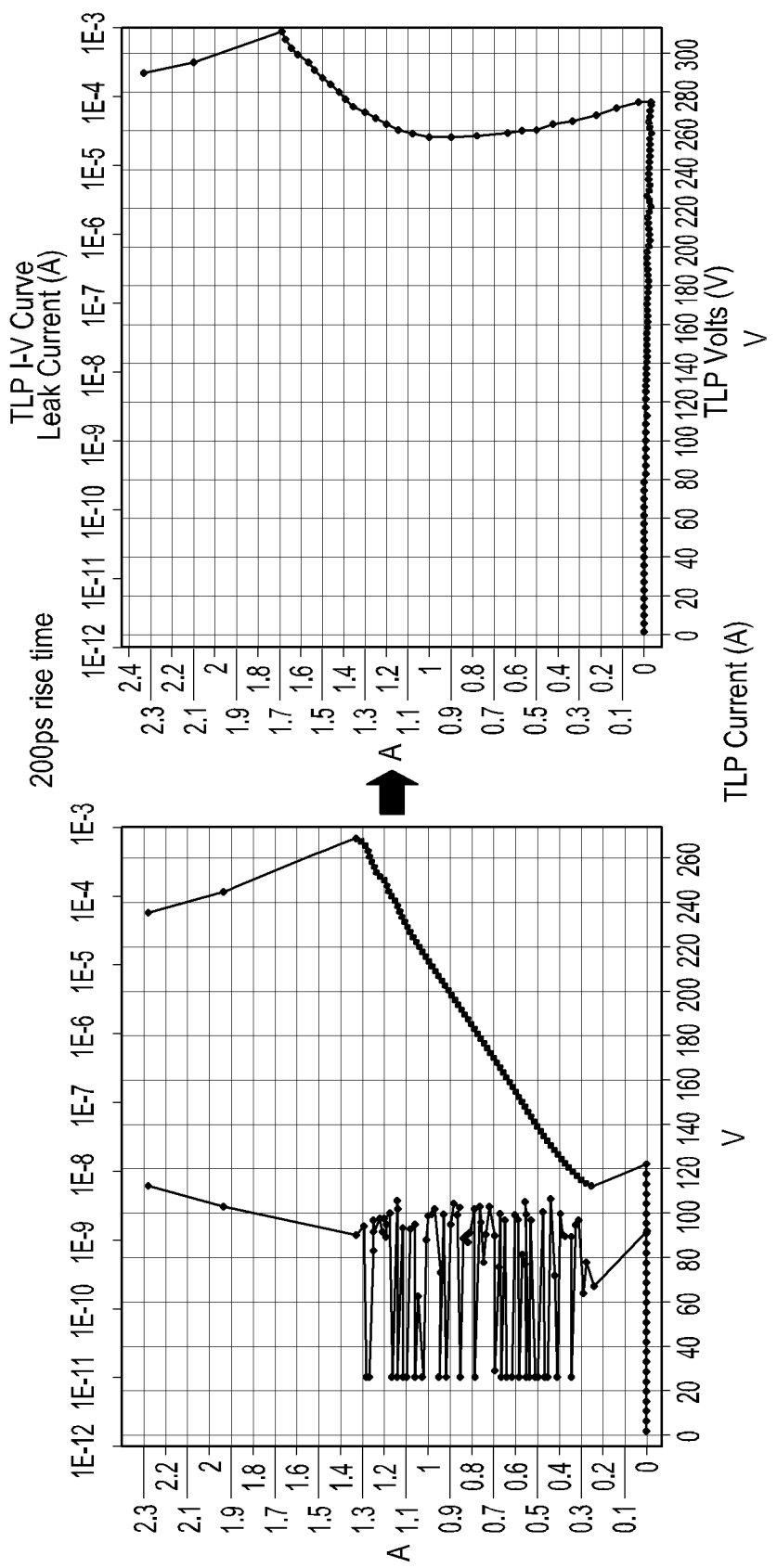
FIGS. 29a and 29b show the response of a protection device without and with, respectively, a filter in association with the protection device.

FIG. 29 shows how a test device response has been modified from a response shown in FIG. 29*a*, where the threshold voltage in response to an overvoltage event with a 200 ps rise time was measured at 125 V, by the inclusion of a filter as described with reference to FIGS. 23 to 28. The device response, when modified by a filter, is shown in FIG. 29 where the threshold voltage has been restored to 270 V for the overvoltage threat.

Should situations arise where high frequency transients are expected to be exceptionally damaging, for example in circuits that must withstand an electromagnetic pulse that may originate from a malicious source, then it is possible to deliberately trigger the protection device to trigger at a reduced threshold in response to transients. This may be achieved by providing a capacitive path from the node 8 to the node of the control terminal 79.

The filter configurations described with respect of FIGS. 23 to 28 may be combined, so for example the arrangement shown in FIG. 26 or 27 may have a capacitance from node 8 to ground as shown in FIG. 23, 24 or 25. Inductor and capacitor combinations may also be used, although the designer needs to ensure that the circuit does not ring excessively in response to voltage change.

As used herein, unless expressly stated to the contrary, "connected" means that one element/feature is directly or indirectly connected to another element/feature, and not necessarily mechanically. Likewise, unless expressly stated to the contrary, "coupled" means that one element/feature is directly or indirectly coupled to another element/feature, and not necessarily mechanically. As used herein, a "node" refers to any internal or external reference point, connection point, junction, signal line, conductive element, or the like at which a given signal, logic level, voltage, data pattern, current, or quantity is present.

The examples given above were for illustration of the invention only, and are not to be used to limit its extent. Furthermore, the claims as presented herein were drafted for initial filing in the USA where single dependency format is the norm. No inference is to be taken from this, and where multiple dependency claims are allowed it is to be assumed that each dependent claim can be multiply dependent on any intervening dependent claims except where such an arrangement is clearly not technically feasible. Various embodiments have been described above. Although described with reference to these specific embodiments, the descriptions are intended to be illustrative and are not intended to be limiting. Various modifications and applications may occur to those skilled in the art.

What is claimed is:

1. An apparatus comprising:
   an overvoltage protection device comprising:
   a first node providing a connection to a node to be protected;
   a second node providing a connection to a discharge node;
   a control node;
   a bipolar transistor comprising a collector coupled to the first node, a base coupled to the control node, and an emitter coupled to the second node;
   a first component having a first impedance coupled between the control node and the discharge node; and
   a second component having a second impedance coupled between the second node and the discharge node, wherein a direct current (DC) holding voltage of the overvoltage protection device is based on a ratio between the first impedance and the second impedance; and
   a filter configured to attenuate a high frequency component of a transient overvoltage event such that an effect of the transient overvoltage event on an alternating current (AC) holding voltage of the overvoltage protection device is reduced, the filter comprising at least one of:
   a first capacitor connected between the first node and the discharge node;
   a second capacitor connected between the control node and the discharge node; or
   an inductor in series connection with the first node.

2. The apparatus of claim 1, wherein the filter comprises the first capacitor, and in which the first capacitor is supplemented by a parasitic capacitance.

3. The apparatus of claim 2, in which the first capacitor is implemented by at least one reverse biased diode.

4. The apparatus of claim 1, in which the discharge node is a power rail or has a low impedance to ground.

5. The apparatus of claim 1, in which the filter and the overvoltage protection device are fabricated within an integrated circuit.

6. The apparatus of claim 1, in which the overvoltage protection device is configured to provide protection against overvoltage events of positive and negative polarity and comprising an NPN semiconductor structure comprising:
   a first N type region configured as the collector of the bipolar transistor;
   a first P type region configured as the base of the bipolar transistor; and
   a second N type region configured as the emitter of the bipolar transistor.

7. The apparatus of claim 1, further comprising a field plate in electrical contact with the base of the bipolar transistor, wherein the field plate overlaps with and is isolated from portions of the collector of the bipolar transistor and the emitter of the bipolar transistor.

8. The apparatus of claim 6, further including a second P type region within at least one of the first or second N type regions, thereby forming a PNP structure with the relevant one of the first or second N type regions and the first P type region.

9. The apparatus of claim 8, in which NPN and the PNP structures cooperate to form a silicon controlled rectifier arrangement.

10. The apparatus of claim 6, in which the first and second N type regions have substantially the same dopant concentration as each other.

11. The apparatus of claim 6, in which the first N type region has a second P type region formed therein, and wherein a first distance exists between a boundary between the first N type region and the first P type region, and the second P type region, and in which the first distance controls a threshold voltage of the protection device.

12. The apparatus of claim 11, in which the second N type region has a third P type region formed therein and wherein a second distance exists between a boundary between the second N type region and the first P type region and the third P type region, and in which the second distance controls a threshold voltage of the protection device.

13. The apparatus of claim 11, in which the first distance between the second P type region and the boundary between the first N type region and the first P type region is defined during masking steps during the manufacture of the protection device.

14. The apparatus of claim 12, in which the second distance between the third P type region and the boundary between the second N type region and the first P type region is defined during masking steps during the manufacture of the protection device.

15. The apparatus of claim 6, in which the overvoltage protection device is configured to provide protection against overvoltage events of positive and negative polarity and comprises:
   an PNP semiconductor structure comprising:
      a first P type region configured as the collector of the bipolar transistor;
      a first N type region configured as the base of the bipolar transistor; and
      a second P type region configured as the emitter of the bipolar transistor;
   wherein a field plate is in electrical contact with the first N type region, and the field plate overlaps with and is isolated from portions of the first and second P type regions.

16. The apparatus of claim 6, in which the bipolar transistor comprises a lateral bipolar transistor wherein collector and emitter regions have substantially the same doping concentrations, and wherein at least one of the collector or emitter further contains a region of material of the same type as the base region spaced apart from the base region and wherein the spacing and dopant concentration control punch through driven conduction in the protection device.

17. The apparatus of claim 1, wherein the filter comprises the inductor in series connection with the first node.

18. The apparatus of claim 1, wherein the filter is configured to adjust a holding voltage of the overvoltage protection device based at least partly on a frequency of the transient overvoltage event.

19. The apparatus of claim 1, wherein the filter is configured to adjust a trigger voltage of the overvoltage protection device based at least partly on a frequency of the transient overvoltage event.

20. The apparatus of claim 1, wherein the filter is configured to provide a symmetric response to transient overvoltage events of positive and negative polarities.

21. The apparatus of claim 1, wherein the filter comprises the second capacitor, and in which the second capacitor is supplemented by a parasitic capacitance.

22. The apparatus of claim 21, in which the second capacitor is implemented by at least one reverse biased diode.

23. The apparatus of claim 1, wherein the first component is a first resistor having the first impedance.

24. The apparatus of claim 23, wherein the second component is a second resistor having the second impedance.

25. The apparatus of claim 1, wherein the second component is a second resistor having the second impedance.

26. The apparatus of claim 6, wherein the bipolar transistor is disposed on an insulating layer, wherein a relatively highly doped P-type region is disposed on the insulating layer, the relatively highly doped P-type region having a higher doping concentration than the first P-type region, and wherein the relatively highly doped P-type region configured to protect the overvoltage protection device from a depletion region spreading upwardly from the insulating layer toward the bipolar transistor.

27. The apparatus of claim 26, further comprising a guard ring surrounding the bipolar transistor.

* * * * *